(12) United States Patent
Okabe et al.

(10) Patent No.: US 11,398,542 B2
(45) Date of Patent: Jul. 26, 2022

(54) METHOD FOR MANUFACTURING DISPLAY DEVICE AND DISPLAY DEVICE INCLUDING ESD COUNTERMEASURE

(71) Applicant: SHARP KABUSHIKI KAISHA, Sakai (JP)

(72) Inventors: Tohru Okabe, Sakai (JP); Shinsuke Saida, Sakai (JP); Shinji Ichikawa, Sakai (JP); Hiroki Taniyama, Sakai (JP); Ryosuke Gunji, Sakai (JP); Kohji Ariga, Aioi (JP); Yoshihiro Nakada, Yonago (JP); Koji Tanimura, Yonago (JP); Yoshihiro Kohara, Yonago (JP); Hiroharu Jinmura, Yonago (JP); Akira Inoue, Yonago (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 169 days.

(21) Appl. No.: 17/041,930

(22) PCT Filed: Mar. 26, 2018

(86) PCT No.: PCT/JP2018/012171
§ 371 (c)(1),
(2) Date: Sep. 25, 2020

(87) PCT Pub. No.: WO2019/186652
PCT Pub. Date: Oct. 3, 2019

(65) Prior Publication Data
US 2021/0013299 A1 Jan. 14, 2021

(51) Int. Cl.
*H01L 27/32* (2006.01)

(52) U.S. Cl.
CPC .... *H01L 27/3276* (2013.01); *H01L 2227/323* (2013.01)

(58) Field of Classification Search
CPC .................... H01L 27/3276; H01L 2227/323
See application file for complete search history.

(56) References Cited

U.S. PATENT DOCUMENTS

| 2010/0238094 A1* | 9/2010 | Cho ..................... G09G 3/3208 345/82 |
| 2013/0050173 A1* | 2/2013 | Koo .................. G02F 1/136204 345/212 |
| 2016/0071884 A1* | 3/2016 | Miyamoto ........ G02F 1/136227 257/59 |
| 2019/0113813 A1 | 4/2019 | Okabe et al. |

FOREIGN PATENT DOCUMENTS

WO 2017/170219 A1 10/2017

* cited by examiner

*Primary Examiner* — Lex H Malsawma
(74) *Attorney, Agent, or Firm* — ScienBiziP, P.C.

(57) ABSTRACT

In a step of forming a plurality of control lines composed of a first metal layer a first metal layer branch line is formed. In a step of forming a plurality of power source lines composed of a second metal layer a second metal layer connecting portion is formed that connects each power source line with the first metal layer branch line via an opening of a first insulating film. In a step of forming a plurality of data signal lines composed of a third metal layer that is formed on a second insulating film the first metal layer branch line formed in the opening of the first insulating and the second metal layer connecting portion formed in an opening of the second insulating film are etched.

16 Claims, 20 Drawing Sheets

METHOD FOR MANUFACTURING DISPLAY DEVICE AND DISPLAY DEVICE INCLUDING ESD COUNTERMEASURE

TECHNICAL FIELD

The disclosure relates to a manufacturing method for a display device, and a display device.

BACKGROUND ART

The manufacturing process of an active matrix substrate constituting a display device includes a step in which static electricity readily occurs. This static electricity charges a portion of various wiring lines in the active matrix substrate, thereby causing high voltage to occur between wiring lines that are insulated. When the high voltage is higher than a breakdown voltage of an insulating film insulating the area between the wiring lines, electrostatic discharge (hereinafter referred to as "ESD") occurs. When ESD occurs, the insulating film between the wiring lines breaks down and a short circuit occurs between the wiring lines, making it no longer possible for the display device to operate properly.

PTL 1 discloses a technique that uses an oxide semiconductor film as a countermeasure against ESD. In this technique, the area between the wiring lines to be ultimately insulated is short-circuited by the oxide semiconductor film of a conductor until an intermediate stage of the manufacturing process. Subsequently, a passivation film for protecting the oxide semiconductor film is annealed, thereby changing the oxide semiconductor film from a conductor to a semiconductor and insulating the area between the wiring lines.

CITATION LIST

Patent Literature

PTL 1: WO 2017/170219 A1 (published Oct. 5, 2017)

SUMMARY

Technical Problem

An object of the disclosure is to provide a countermeasure against ESD of a display device by a technique different from the countermeasure described above that uses an oxide semiconductor film.

Solution to Problem

A manufacturing method for a display device according to one aspect embodying the disclosure is a manufacturing method for a display device including a display region, a frame region positioned around the display region, a plurality of control lines, a plurality of power source lines parallel to the plurality of control lines, a plurality of data signal lines intersecting the plurality of control lines, the plurality of control lines, the plurality of power source lines, and the plurality of data signal lines being provided from the display region to the frame region, a control circuit forming a longitudinal direction in a direction orthogonal to the plurality of control lines in the frame region, the control circuit being configured to input a control signal to the plurality of control lines, a base insulating film, a first metal layer forming the plurality of control lines, a first insulating film, a second metal layer forming the plurality of power source lines, a second insulating film, and a third metal layer forming the plurality of data signal lines, the base insulating film, the first metal layer, the first insulating film, the second metal layer, the second insulating film, and the third metal layer being layered in this order, and the plurality of control lines being electrically connected to the control circuit via the second metal layer or the third metal layer in the frame region. The method includes a base insulating film step of forming the base insulating film, a first metal layer step of forming the first metal layer and patterning the first metal layer, thereby forming the plurality of control lines and forming, in a gap between respective formation positions of the control circuit and the display region, a first metal layer branch line branching from each of the plurality of control lines toward a control line, among the plurality of control lines, adjacent thereto, a first insulating film step of forming the first insulating film and patterning the first insulating film, thereby forming, in the first insulating film, a first insulating film first opening overlapping the first metal layer branch line, a second metal layer step of forming the second metal layer and patterning the second metal layer, thereby forming the plurality of power source lines and, in the gap, forming a second metal layer branch line branching from each of the plurality of power source lines and forming a second metal layer connecting portion connected to the first metal layer branch line via the first insulating film first opening, a second insulating film step of forming the second insulating film and patterning the second insulating film, thereby forming, in the second insulating film, a second insulating film first opening exposing the first insulating film first opening, a portion of the second metal layer branch line, and a portion of the second metal layer connecting portion, and a third metal layer step of forming the third metal layer, patterning the third metal layer, and etching the first metal layer branch line formed in the first insulating film first opening, and the second metal layer branch line and the second metal layer connecting portion formed in the second insulating film first opening.

Further, a display device according to one aspect embodying the disclosure includes a display region, a frame region positioned around the display region, a plurality of control lines, a plurality of power source lines parallel to the plurality of control lines, a plurality of data signal lines intersecting the plurality of control lines, the plurality of control lines, the plurality of power source lines, and the plurality of data signal lines being provided from the display region to the frame region, a control circuit forming a longitudinal direction in a direction orthogonal to the plurality of control lines in the frame region, the control circuit being configured to input a control signal to the plurality of control lines, a base insulating film, a first metal layer forming the plurality of control lines, a first insulating film, a second metal layer forming the plurality of power source lines, a second insulating film, and a third metal layer forming the plurality of data signal lines, the base insulating film, the first metal layer, the first insulating film, the second metal layer, the second insulating film, and the third metal layer being layered in this order, and the plurality of control lines being electrically connected to the control circuit via the second metal layer or the third metal layer in the frame region. In a gap between the control circuit and the display region, a first metal layer first branch line branching from a first control line to a second control line of adjacent control lines of the plurality of control lines, and a first metal layer second branch line branching from the second control line to the first control line are formed. The first metal layer first branch line and the first metal layer second branch line face each other with the first insulating film first opening formed in the first insulating film interposed therebetween. A second metal layer intersecting portion including a power source line, among the plurality of power source lines, between the first control line and the second control line and formed by the second metal layer is formed between the first control line and the second control line, intersecting the first metal layer first branch line and the first metal layer second branch line. In the second insulating film, a second insulating film first opening is formed including the first insulating film first opening, and the second metal layer intersecting portion is formed surrounding the first insulating film first opening and the second insulating film first opening.

Advantageous Effects of Disclosure

In the manufacturing method for a display device and the display device, the plurality of control lines and the plurality of power source lines can be electrically connected until the control lines are electrically connected to the control circuit via the second metal layer or the third metal layer. As a result, the risk of breakdown of the insulating film can be reduced compared to a state in which the plurality of control lines and the plurality of power source lines are each formed electrically insulated.

DESCRIPTION OF EMBODIMENTS

Basic Form of Display Device
1. Manufacturing Process of Display Device and Cross-Sectional Configuration of Display Region Hereinafter, "the same layer" means that the layer is formed in the same process (film formation step), "a lower layer" means that the layer is formed in an earlier process than the process in which the layer being compared is formed, and "an upper layer" means that the layer is formed in a later process than the process in which the layer being compared is formed.

Figure 1:
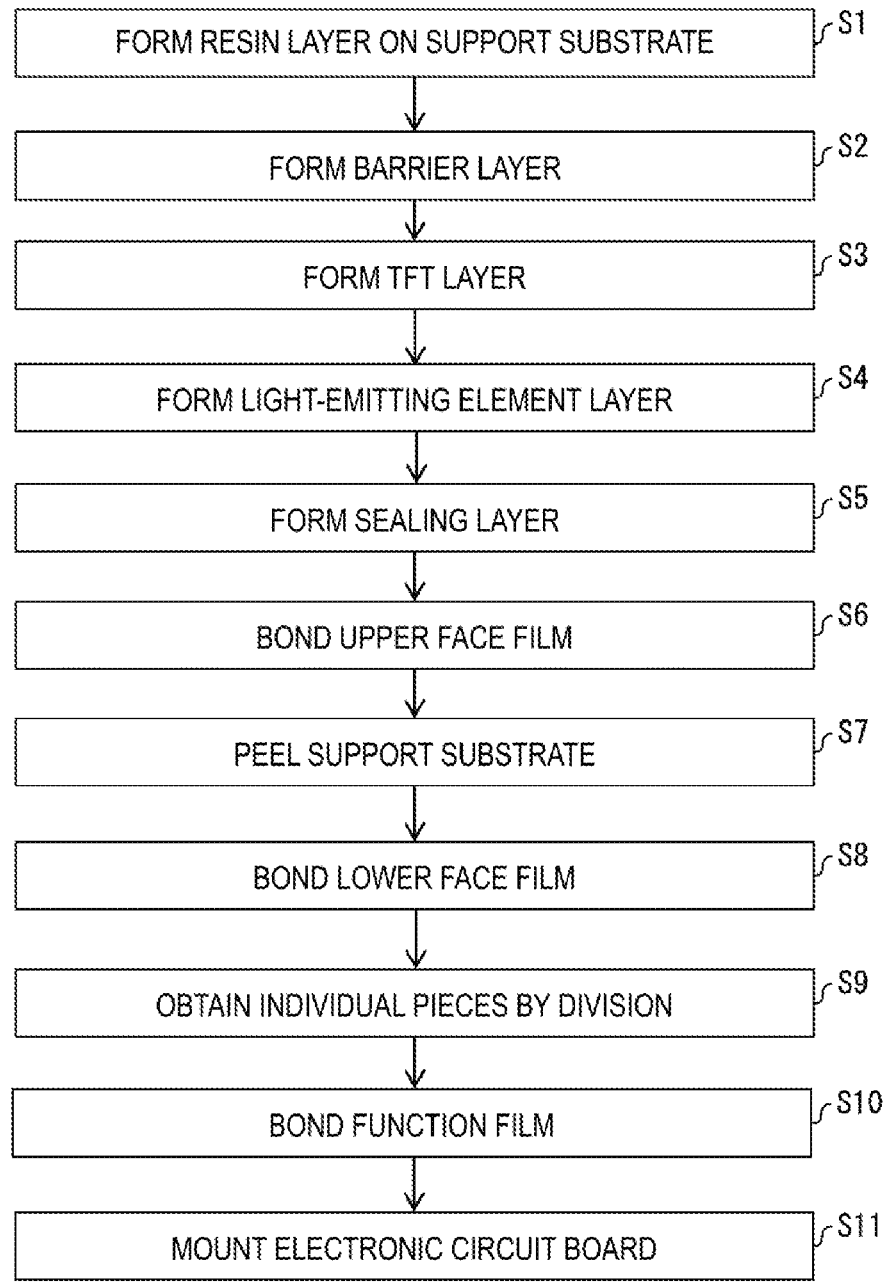
FIG. 1 is a flowchart illustrating a manufacturing method for a display device according to one aspect embodying the disclosure.
Figure 2:
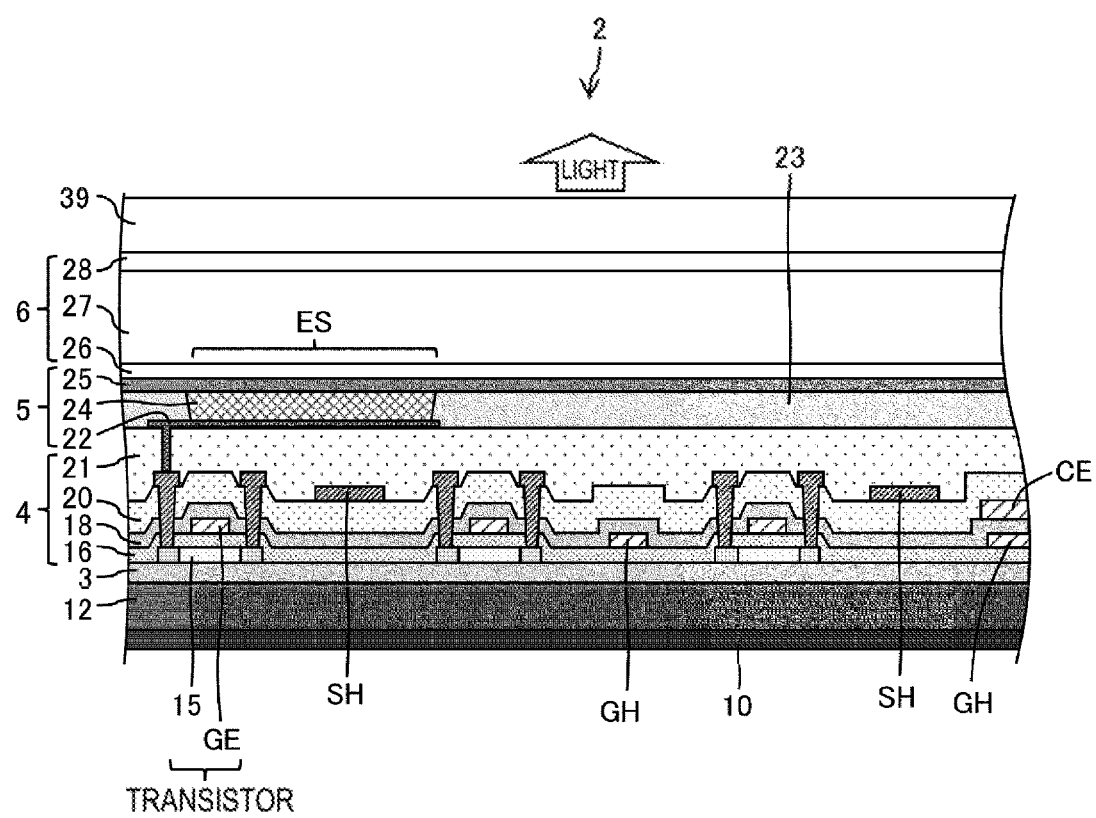
FIG. 2 is a cross-sectional view illustrating a configuration of a display region of the display device.

FIG. 1 is a flowchart illustrating an example of a manufacturing method for a display device. FIG. 2 is a cross-sectional view illustrating a configuration of a display region of the display device. Note that, in the following description, a flexible display device is assumed, but the present embodiment is not limited to a flexible display device.

When a flexible display device is manufactured, as illustrated in FIG. 1 and FIG. 2, first, a resin layer 12 is formed on a support substrate (a mother glass, for example) that is transparent (step S1). Next, a base insulating film (barrier layer, moisture-proof layer) 3 is formed (step S2). Next, a TFT layer 4 is formed (step S3). Next, a top-emitting type light-emitting element layer 5 is formed (step S4). Next, a sealing layer 6 is formed (step S5). Next, an upper face film is bonded to the sealing layer 6 (step S6).

Next, the support substrate is peeled from the resin layer 12 by irradiation of laser light or the like (step S7). Next, a lower face film 10 is bonded to a lower face of the resin layer 12 (step S8). Next, a layered body including the lower face film 10, the resin layer 12, the base insulating film 3, the TFT layer 4, the light-emitting element layer 5, and the sealing layer 6 is divided and a plurality of individual pieces are obtained (step S9). Next, a function film 39 is bonded to the obtained individual pieces (step S10). Next, an electronic circuit board (for example, an integrated circuit (IC) chip and a flexible printed circuit (FPC)) is mounted onto a portion (terminal portion) outside (non-display region, frame region) of the display region in which a plurality of subpixels are formed (step S11). Note that steps S1 to S11 are performed by a display device manufacturing apparatus (including a film formation apparatus configured to perform each process of the steps S1 to S5).

Examples of a material of the resin layer 12 include a polyimide or the like. A portion of the resin layer 12 can be replaced with a two-layer resin film (for example, a polyimide film) and an inorganic insulating film interposed therebetween.

The base insulating film 3 is a layer that prevents impurities such as moisture and oxygen from entering the TFT layer 4 and the light-emitting element layer 5, and can be constituted by a silicon oxide film, a silicon nitride film, or a silicon oxynitride film, or by a layered film of these, formed by chemical vapor deposition (CVD), for example.

The TFT layer 4 includes a semiconductor layer 15, a gate insulating film (inorganic insulating film) 16 in an upper layer overlying the semiconductor layer 15, a first metal layer (gate electrode GE and gate wiring line GH) in an upper layer overlying the gate insulating film 16, a first insulating film (inorganic insulating film) 18 in an upper layer overlying first metal layer, a second metal layer (power source line (not illustrated in FIG. 2) and a capacitance electrode CE) in an upper layer overlying the first insulating film 18, a second insulating film (inorganic insulating film) 20 in an upper layer overlying the second metal layer, a third metal layer (data signal line (source wiring line) SH) in an upper layer overlying the second insulating film 20, and a flattening film 21 (interlayer insulating film) in an upper layer overlying the third metal layer.

The semiconductor layer 15 includes, for example, a low-temperature polysilicon (LTPS) or an oxide semiconductor (for example, an In—Ga—Zn—O based semiconductor), and a transistor (TFT) is configured to include the semiconductor layer 15 and the gate electrode GE. While, in FIG. 2, the transistor is illustrated as having a top gate structure, the transistor may have a bottom gate structure.

The gate electrode GE, the gate wiring line GH, the capacitance electrode CE, and the source wiring line SH are each composed of a single layer film or a layered film of a metal including at least one of aluminum, tungsten, molybdenum, tantalum, chromium, titanium, and copper, for example. The TFT layer 4 in FIG. 2 includes a single-layer semiconductor layer and a three-layer metal layer.

The gate insulating film 16, the first insulating film 18, and the second insulating film 20 may be configured by a silicon oxide (SiOx) film or a silicon nitride (SiNx) film, or a layered film thereof, formed using CVD, for example. The flattening film 21 can be formed of, for example, a coatable organic material such as a polyimide or an acrylic.

The light-emitting element layer 5 includes an anode 22 in an upper layer overlying the flattening film 21, an edge cover 23 having insulating properties and covering an edge of the anode 22, an electroluminescent (EL) layer 24 in an upper layer overlying the edge cover 23, and a cathode 25 in an upper layer overlying the EL layer 24. The edge cover 23 is formed by applying an organic material such as a polyimide or an acrylic and then patterning the organic material by photolithography, for example.

On a subpixel-by-subpixel basis, a light-emitting element ES (for example, an organic light-emitting diode (OLED) or a quantum dot light-emitting diode (QLED)) having an island shape and including the anode 22, the EL layer 24, and the cathode 25 is formed in the light-emitting element layer 5, and a subpixel circuit that controls the light-emitting element ES is formed in the TFT layer 4.

For example, the EL layer 24 is formed by layering a hole injection layer, a hole transport layer, a light-emitting layer, an electron transport layer, and an electron injection layer in this order, from the lower layer side. The light-emitting layer is formed into an island shape at an opening of the edge cover 23 (on a subpixel-by-subpixel basis) by vapor deposition or an ink-jet method. Other layers are formed into an island shape or a solid-like shape (common layer). A configuration is also possible in which one or more layers of the hole injection layer, the hole transport layer, the electron transport layer, and the electron injection layer are not formed.

In a case where the light-emitting layer of the OLED is formed by vapor deposition, a fine metal mask (FMM) is used. The FMM is a sheet (made of an invar material, for example) including a large number of openings, and the light-emitting layer (corresponding to one subpixel) having an island shape is formed by an organic material passed through one of the openings.

The light-emitting layer of the QLED can, for example, form a light-emitting layer (corresponding to one subpixel) having an island shape by applying by ink-jet a solvent having quantum dots diffused therein.

The anode (anode electrode) 22 is formed by a layering of indium tin oxide (ITO) and silver (Ag) or an alloy containing Ag, for example, and has light reflectivity. The cathode (cathode electrode) 25 can be formed by a transparent conductive material such as a MgAg alloy (extremely thin film), ITO, or indium zinc oxide (IZO).

In a case where the light-emitting element ES is an OLED, positive holes and electrons recombine inside the light-emitting layer in response to a drive current between the anode 22 and the cathode 25, and light is emitted as a result of excitons, which are generated by the recombination, falling into a ground state. Since the cathode 25 is transparent and the anode 22 has light reflectivity, the light emitted from the EL layer 24 travels upward and becomes top-emitting.

In a case where the light-emitting element ES is a QLED, positive holes and electrons recombine inside the light-emitting layer in response to a drive current between the anode 22 and the cathode 25, and light (fluorescence) is emitted as a result of excitons, which are generated by the recombination, transitioning from a conduction band level to a valence band level of the quantum dots.

A light-emitting element (such as an inorganic light-emitting diode) other than the OLED and the QLED may be formed on the light-emitting element layer 5.

The sealing layer 6 is transparent, and includes an inorganic sealing film 26 for covering the cathode 25, an organic buffer film 27 in an upper layer overlying the inorganic sealing film 26, and an inorganic sealing film 28 in an upper layer overlying the organic buffer film 27. The sealing layer 6 covering the light-emitting element layer 5 prevents foreign matter, such as moisture and oxygen, from penetrating into the light-emitting element layer 5.

Each of the inorganic sealing film 26 and the inorganic sealing film 28 is an inorganic insulating film and can be formed of, for example, a silicon oxide film, a silicon nitride film, or a silicon oxynitride film, or a layered film of these, formed by CVD. The organic buffer film 27 is a transparent organic film having a flattening effect and can be formed of a coatable organic material such as an acrylic. The organic buffer film 27 can be formed by, for example, an ink-jet application, but a bank for stopping droplets may be provided in the non-display region.

The lower face film 10 is, for example, a polyethylene terephthalate (PET) film for realizing a display device having excellent flexibility by being bonded to the lower face of the resin layer 12 after the support substrate is peeled off. The function film 39 has at least one of an optical compensation function, a touch sensor function, and a protection function, for example.

While the above has described a flexible display device, in the case of manufacturing a non-flexible display device, generally formation of a resin layer, replacement of the substrate, and the like are not required, and thus the layering process of steps S2 to S5 on the glass substrate is performed and subsequently the flow transitions to step S9, for example.

2. Manufacturing Process of Active Matrix Substrate

A manufacturing process of an active matrix substrate constituting the display device will be described on the basis of the flowchart illustrated in FIG. 3 (refer also to the cross-sectional view of FIG. 2).

Figure 3:
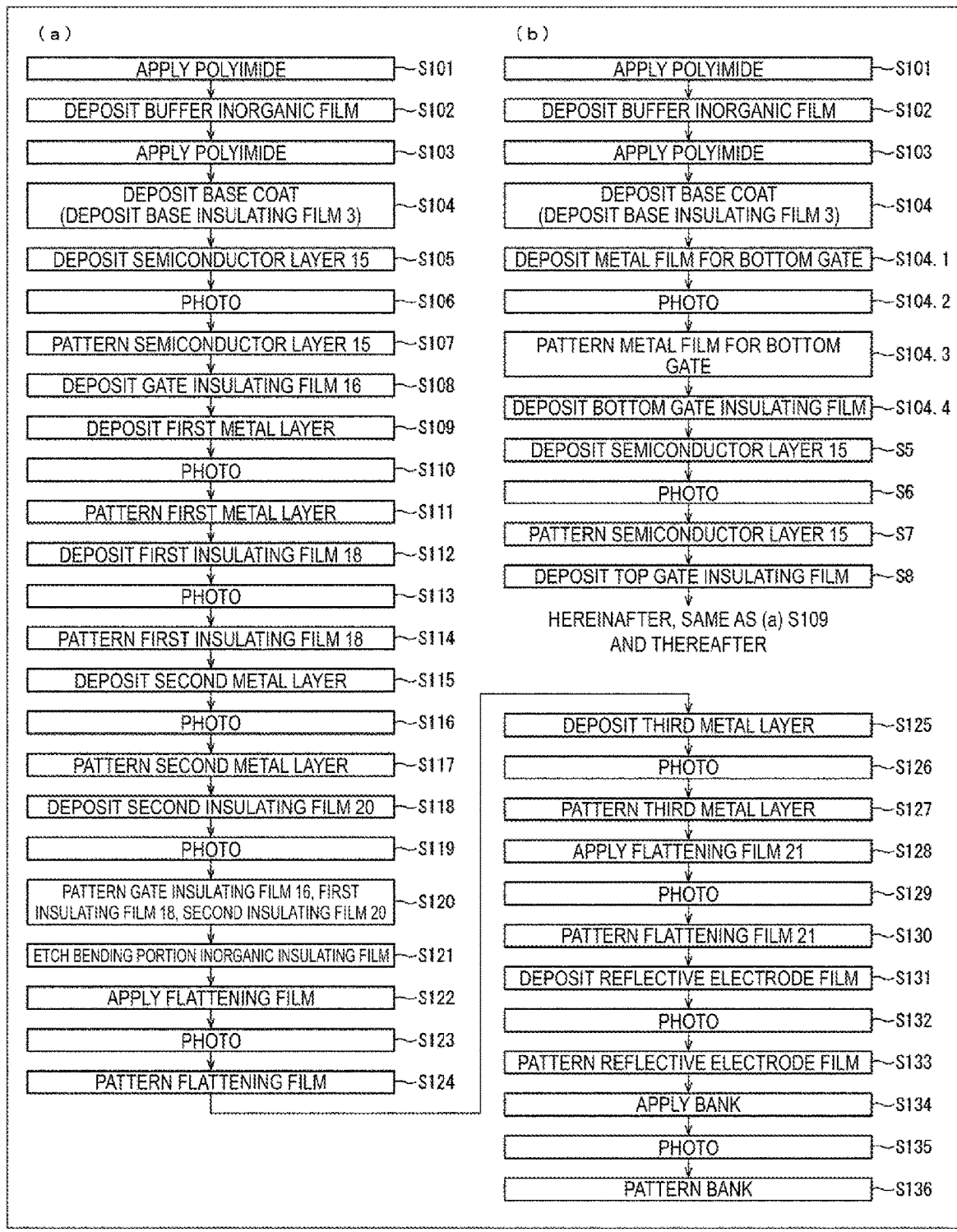
FIG. 3 is a flowchart illustrating a portion of steps of the flowchart of FIG. 1 in further detail.

Note that the flowchart in FIG. 3 illustrates in more detail the processes included in steps S1 to S3 and a portion of the processes included in step S4 in the flowchart of FIG. 1. Further, in FIG. 3, "deposit" refers to forming a film by deposition. Furthermore, in FIG. 3, "photo" indicates that photolithography is performed by a combination with "patterning" in the next step.

First, a manufacturing process of an active matrix substrate in which the transistor has a top gate structure will be described on the basis of (a) of FIG. 3.

A polyimide is applied onto the support substrate, a buffer inorganic film is deposited, and a polyimide is further applied, thereby forming the resin layer 12 (steps S101 to S103).

Hereinafter, in a case where the underlayer at the time of application or deposition is not specified, the front face formed by the film or layer formed up to the previous stage is the underlayer.

A base coat is deposited to form the underlying insulating film 3 (step S104).

A semiconductor layer is deposited, photolithography is performed, and the patterned semiconductor layer 15 is formed (steps S105 to S107).

An inorganic insulating film is deposited to form the gate insulating film 16 (step S108).

A first metal layer is deposited, photolithography is performed, and the gate electrode GE and the gate wiring line GH are formed by patterning the first metal layer (steps S109 to S111).

An inorganic insulating film is deposited and photolithography is performed, thereby forming the first insulating film 18 provided with a contact hole in a predetermined position (steps S112 to S114).

A second metal layer is deposited, photolithography is performed, and the power source line and the capacitance electrode CE are formed by patterning the second metal layer (steps S115 to S117).

An inorganic insulating film is deposited and photolithography is performed, thereby forming the second insulating film 20 provided with a contact hole in a predetermined position (steps S118 to S120). Note that formation of the contact holes in steps S119 and S120 is performed on the gate insulating film 16 and the first insulating film 18.

The inorganic insulating film deposited on a bending portion 54 (refer to FIG. 4 described later) is removed by etching (step S121).

A flattening film is applied, photolithography is performed, and a patterned flattening film is formed (steps S122 to S124). Note that this flattening film is omitted in the configuration in FIG. 2.

A third metal layer is deposited, photolithography is performed, and the source wiring line SH is formed by patterning the third metal layer (steps S125 to S127).

A flattening film is applied, photolithography is performed, and the patterned flattening film 21 is formed (steps S128 to S130).

A reflective electrode layer is deposited, photolithography is performed, and the anode 22 is formed by patterning the reflective electrode layer (steps S131 to S133).

A bank is applied, photolithography is performed, and the patterned bank is formed (steps S134 to S136).

On the other hand, the manufacturing process of the active matrix substrate in which the transistor has a double gate structure may include, between step S104 and step S105 in (a) of FIG. 3, forming a bottom gate metal layer by the deposition, photolithography, and patterning of a bottom gate metal layer, and further depositing a bottom gate insulating film (steps (S104.1 to S104.4), as illustrated in (b) of FIG. 3.

3. Planar Configuration of Display Device

Figure 4:
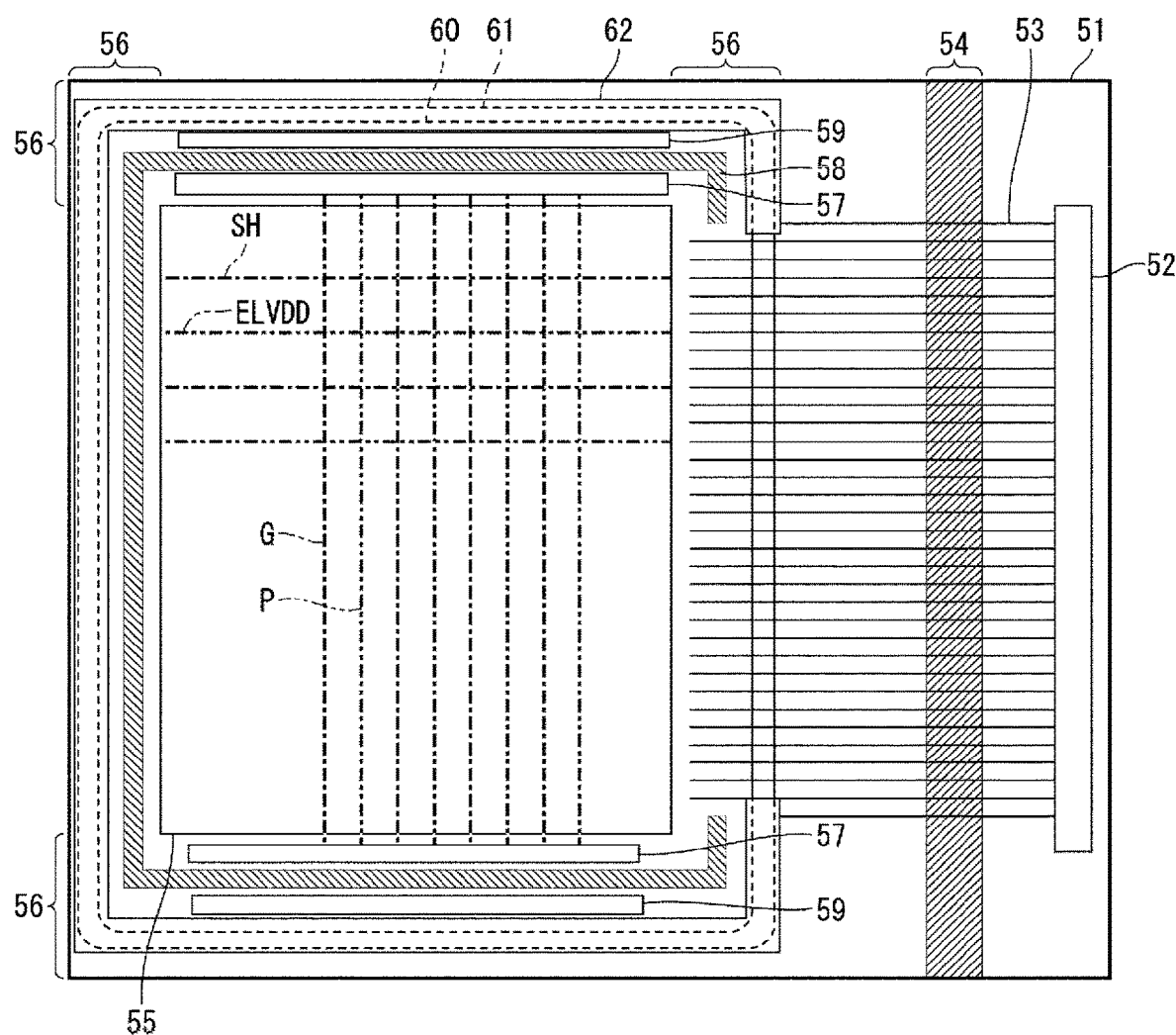
FIG. 4 is a plan view of the display device.

A planar configuration of the display device will be described on the basis of a plan view of the display device illustrated in FIG. 4. Note that FIG. 4 illustrates a flexible display device.

A terminal portion 52 is formed along one end (right end in FIG. 4) of a flexible substrate 51 (including the lower face film 10, the resin layer 12, and the like) having a rectangular shape. From the terminal portion 52, a lead wiring line 53 is drawn toward a center side of the flexible substrate 51. The bending portion 54 is formed midway on the lead wiring line 53. The flexible substrate 51 is bendable at the bending portion 54, and thus the terminal portion 52 is disposed on a back face side of the display device.

A display region 55 and a frame region 56 that surrounds the display region 55 are formed on a tip side of the lead wiring line 53. Note that the terminal portion 52 and the bending portion 54 may also be referred to as the frame region 56.

The following wiring lines are provided from the display region 55 to the frame region 56.

The gate wiring line GH and a large number of control lines G composed of a light emission control line and the like, formed by the first metal layer.

A large number of power source lines P formed by the second metal layer, disposed parallel to the control lines G, and including initialization power source lines, high-voltage power source lines ELVDD, and the like.

A large number of the data signal lines SH and the high-voltage power source lines ELVDD formed by the third metal layer and disposed intersecting the control lines G.

Note that the high-voltage power source lines ELVDD of the second metal layer and the high-voltage power source lines ELVDD of the third metal layer intersect each other and are electrically connected at the intersections.

Furthermore, the high-voltage power source lines ELVDD are connected to each other and the initialization power source lines are connected to each other by routing from a source layer composed of a different layer at an edge (gap between the respective formation positions of a control circuit 57 and the display region 55). Note that the plurality of initialization power source lines may be connected to each other as they are in the second metal layer without the routing from the source layer.

The types of wiring lines formed in each of the first metal layer, the second metal layer, and the third metal layer are not limited to those described above, and can be changed as appropriate. For example, the gate wiring line GH and the initialization power source lines may be formed as the first metal layer, and the high-voltage power source lines ELVDD and the light emission control line may be formed as the second metal layer. That is, the structure of the present embodiment is applicable to wiring lines formed by the first metal layer or the second metal layer and electrically isolated in the display region 55.

The control circuit (gate signal control circuit) 57 is disposed in the frame region 56, forming a longitudinal direction in a direction orthogonal to the control lines G. The control circuit 57 inputs a control signal to the control lines G. Further, a light emission control circuit 59 is disposed along the control circuit 57, outside the control circuit 57 with a trench 58 interposed therebetween. The light emission control circuit 59 inputs a control signal to the light emission control line. Note that while, in practice, circuits for inputting signals and power to other wiring lines are also disposed, these are omitted in FIG. 4.

A first bank 60 and a second bank 61 for stopping droplets during ink-jet application are formed surrounding the display region 55, the trench 58, and various circuits including the control circuit 57 and the light emission control circuit 59. A metal layer 62 composed of the same layer as the data signal line SH is formed above the first bank 60 and the second bank 61, extending along the first bank 60 and the second bank 61 except for the disposed region of the lead wiring line 53.

4. Countermeasure Against ESD

The following describes a countermeasure against new ESD on the basis of the display device described above. The basic configuration associated with the present countermeasure in the display device serving as the basis is as follows.

That is, the display device includes:
the display region 55 and the frame region 56 positioned around the display region 55,
the plurality of control lines G, the plurality of power source lines P parallel to the plurality of control lines G, and the plurality of data signal lines SH intersecting the plurality of control lines G, each provided from the display region 55 to the frame region 56,
the control circuit 57 disposed in the frame region 56, forming a longitudinal direction orthogonal to the plurality of control lines G, and configured to input a control signal to the plurality of control lines G, and
the base insulating film (moisture-proof layer) 3, the first metal layer (gate layer) configured to form the plurality of control lines G, the first insulating film 18, the second metal layer (M3) configured to form the plurality of power source lines P, the second insulating film 20, and the third metal layer (source layer) configured to form the plurality of data signal lines SH, layered sequentially in this order.
Further, in the display device:
the plurality of control lines G are electrically connected to the control circuit 57 via the second metal layer or the third metal layer in the frame region 56.

As illustrated in FIG. 4, a large number of locations in which the wiring lines overlap each other with an insulating film interposed therebetween (hereinafter referred to as a "overlapping locations") are formed in the active matrix substrate constituting the display device. In particular, in an active matrix substrate in which the light-emitting element ES is an OLED or a QLED, a wiring line density in a pixel is high and the number of TFTs is great compared to those of an active matrix substrate for a liquid crystal display (LCD), resulting in a large number of overlapping locations.

When an overlapping location exists, the insulating film at the overlapping locations breaks down by the ESD generated in the manufacturing process of the active matrix substrate, and the risk of current leakage due to a short-circuit between the wiring lines arises. In particular, in an active matrix substrate for an OLED or QLED having a large number of overlapping locations, the risk described above is high, which is a factor that reduces yield.

A configuration in which a short ring is installed in an outer peripheral region of the active matrix substrate is conceivable as a countermeasure against ESD. However, this configuration makes use of a short ring initially formed after the third metal layer is patterned. Isolated wiring lines (control lines and power source lines, for example) formed by the first metal layer and the second metal layer in the display region 55 are electrically connected via the third metal layer. As a result, these wiring lines are connected to the short ring in the outer peripheral region. That is, in the configuration described above, the countermeasure against ESD is initially performed after the third metal layer is patterned, and a countermeasure against ESD is not performed in the processes up until then. Note that in the process of dividing the substrate, these short rings are electrically disconnected.

As described above, in the display device, the plurality of control lines G are electrically connected to the control circuit 57 via the second metal layer or the third metal layer in the frame region 56. This is because common wiring lines such as a driver (GDM) of the scanning signal line, the high-voltage power source line (ELVDD), the low power supply voltage line (ELVSS), and the like are disposed around the display region 55, and the plurality of control lines G and the control circuit 57 must be connected to each other while avoiding these.

Thus, until the connections described above are made, the plurality of control lines G in the region between the control circuit 57 are typically independent island wiring lines. When static electricity occurs in such an island wiring line, the electrical charge cannot escape from the island wiring line, and a potential difference of the island wiring line with respect to the other wiring lines or the like readily increases. As a result, such an island wiring line readily results in breakdown of the insulating film.

Furthermore, the electrically isolated control line G is likely to generate static electricity after being formed because the process is in an early stage and the process of forming the insulating film using a vacuum device is after its formation.

Note that the power source line P is also formed in a process after the control line G, and thus the same problem as described above arises in relation to the breakdown of the insulating film, although a difference in degree exists. Furthermore, a similar problem occurs when an isolated wiring line is formed in the display region 55 by the second metal layer. That is, the present embodiment can be applied to the island wiring lines of the first metal layer or the second metal layer in the display region 55.

Therefore, in the present embodiment, the countermeasure against ESD outlined below is taken.
When the plurality of control lines G are formed, a coupling portion is provided that couples the control lines G adjacent to each other.
When the plurality of power source lines P are formed, a branch portion is provided that extends from each power source line P to a region overlapping the coupling portion. Then, the branch portion of the power source line P and the coupling portion of the control line G are connected via a via hole formed in the first insulating film 18.

Thus, the plurality of control lines G and the plurality of power source lines P can all be in an electrically connected state and yet, with a portion having a relatively high resistance value being provided to a portion thereof, the current generated by static electricity is caused to short-circuit in that portion. As a result, an increase in the potential difference between each wiring line and the other wiring lines or the like can be suppressed, and the risk of breakdown of the insulating film can be reduced.

Note that, in the following, the above-described countermeasure is referred to as "ESD countermeasure".

On the other hand, the plurality of control lines G and the plurality of power source lines P must ultimately be electrically independent. Therefore, in the present embodiment, the following measure is further taken.

In the patterning at the time of formation of the plurality of data signal lines SH, the connection between the branch portion of the power source line P and the coupling portion of the control line G is divided, and the coupling portion coupling the control lines G to each other is divided.

This can be achieved by performing an over-etching in the etching for forming a pattern of the data signal line SH.

Note that, in the following, the above-described measure is referred to as "division measure".

Further, when the division measure is performed, a short ring is formed by the third metal layer that forms the data signal lines SH, and thus a countermeasure against ESD by this short ring is possible. That is, the "ESD countermeasure" described above is particularly effective in the time period up to the patterning of the third metal layer.

A more specific configuration of the ESD countermeasure will be described below.

First Embodiment

Figure 5:
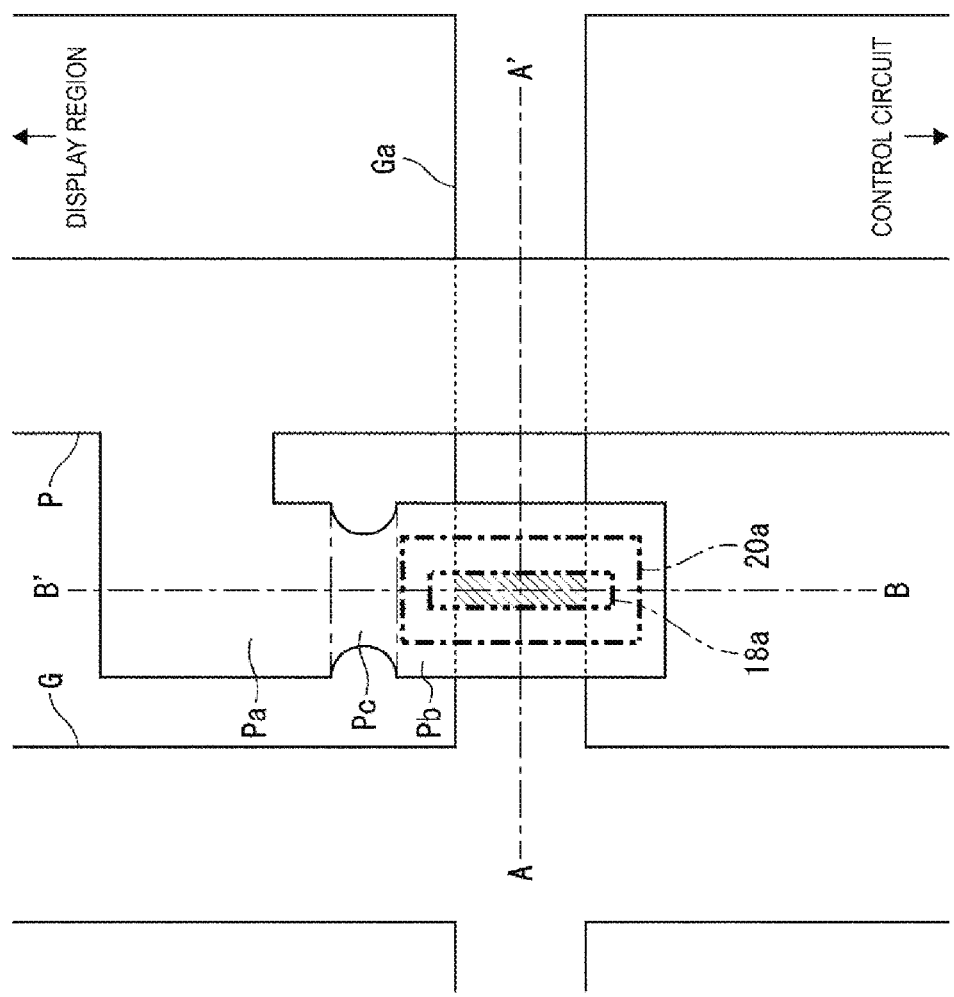
FIG. 5 is a plan view illustrating, in one aspect (first embodiment) of an active matrix substrate constituting the display device, a configuration of a portion of the active matrix substrate (a portion of a gap between respective formation positions of the control circuit and the display region), in an intermediate stage of manufacture.
Figure 6:
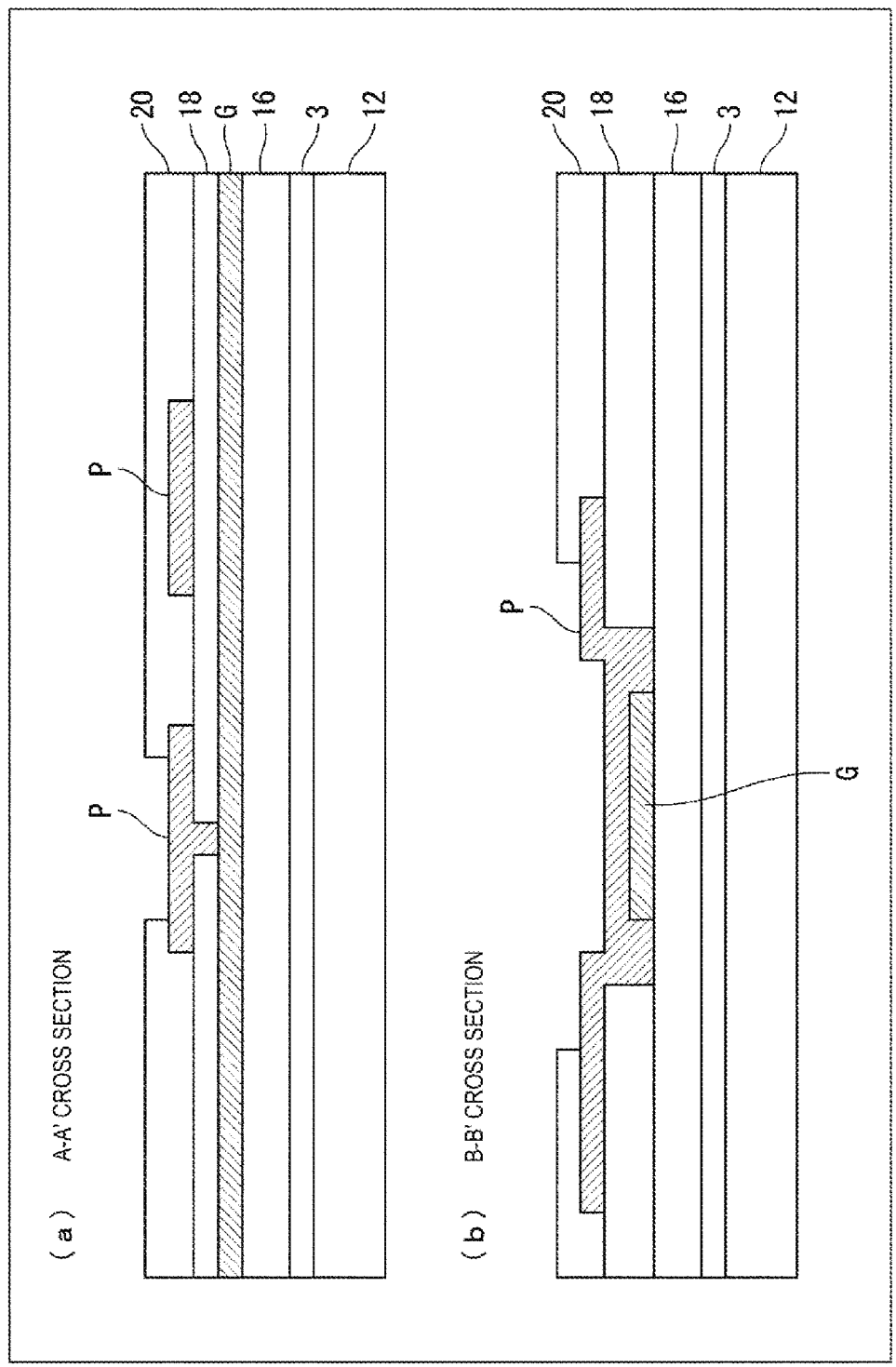
FIG. 6 illustrates cross-sectional views of cross sections taken along line A-A' and line B-B' in FIG. 5.

FIG. 5 and FIG. 6 are a plan view and a cross-sectional view, respectively, illustrating the state of the active matrix substrate immediately prior to step S125, that is, the process of forming the third metal layer, in the flowchart of FIG. 3. Note that (a) and (b) of FIG. 6 are a cross-sectional view taken along line A-A' and a cross-sectional view taken along line B-B' in FIG. 5, respectively.

In the present embodiment, steps S122 to S124 related to the flattening film are omitted. In a case where the flattening film is formed, patterning may be performed in the same manner as with the second insulating film 20 in the cross sections in FIG. 6.

The following mainly describes the distinctive steps among those through which the active matrix substrate of the first embodiment realizes the states of FIG. 5 and FIG. 6.

Base insulating film step (step S104): The base insulating film 3 is formed.

First metal layer step (steps S109 to S111): The first metal layer is formed and the first metal layer is patterned, thereby forming the plurality of control lines G and forming, in the gap between the respective formation positions of the control circuit 57 and the display region 55 subsequently formed, a first metal layer branch line Ga branching from each of the control lines G toward the control line G adjacent thereto.

Note that the control lines G, among the plurality of control lines G, adjacent to each other share the first metal layer branch line Ga. Further, the first metal layer branch line Ga has a wiring line width that is formed smaller than a wiring line width of the control line G. Thus, even in a case where the electrical resistance of the first metal layer branch line Ga is greater than that of the control line G and static electricity occurs until the second metal layer is formed, a short circuit can occur in the first metal layer branch line Ga not contributing as a wiring line of the actual signal. Note that, although not illustrated, when a region overlapping the power source line P and a region not overlapping the power source line P are compared, the wiring line width of the first metal layer branch line Ga in the region not overlapping the power source line P is preferably small (refer to a third modified example (FIG. 9) described below). This makes it possible to suppress the effect of a short-circuit, should a short-circuit occur in the first metal layer branch line Ga, on the power source line P subsequently formed.

First insulating film step (steps S112 to S114): The first insulating film 18 is formed and the first insulating film 18 is patterned, thereby forming, in the first insulating film 18, a first insulating film first opening 18a overlapping the first metal layer branch line Ga. Thus, the first metal layer branch line Ga is exposed by the first insulating film first opening 18a.

Note that the first insulating film first opening 18a needs to be formed wider than the line width of the first metal layer branch line Ga exposed by the first insulating film first opening 18a. This is because, as described later, the electrical connection of the control lines G adjacent to each other is divided simultaneously with the patterning of the third metal layer.

Second metal layer step (steps S115 to S117): The second metal layer is formed and the second metal layer is patterned, thereby forming the plurality of power source lines P and forming, in the gap described above, a second metal layer branch line Pa branching from each power source line P and a second metal layer connecting portion Pb that connects to the first metal layer branch line Ga via the first insulating film first opening 18a. Note that the hatched portions in FIG. 5 illustrate portions where the first metal layer branch line Ga exposed by the first insulating film first opening 18a and the second metal layer connecting portion Pb come into contact.

Note that, in the second metal layer step, a constriction Pc, that is, a portion where a width of the second metal layer branch line Pa or the second metal layer connecting portion Pb is locally narrowed, may be formed in a portion from the second metal layer branch line Pa to the second metal layer connecting portion Pb. This constriction Pc is formed locally reducing a cross-sectional area of a current path when current flows between the power source line P and the control line G.

Second insulating film step (steps S118 to S120): The second insulating film 20 is formed and the second insulating film 20 is patterned, thereby forming a second insulating film first opening 20a in the second insulating film 20, including the first insulating film first opening 18a. Then, the second metal layer connecting portion Pb is exposed by the second insulating film first opening 20a.

Note that, in the plan view of FIG. 5, the first insulating film 18 and the second insulating film 20 are omitted, and regions of the first insulating film first opening 18a and the second insulating film first opening 20a are illustrated by double-dot dash lines and single-dot dash lines, respectively.

As described above, the "ESD countermeasure" described above can be realized during the time period up to when the "division measure" described above is taken.

Note that the portion where the constriction Pc is formed has a relatively high resistance value. Then, in a given control line G and a given power source line P, disconnection (electrostatic breakdown) occurs in the constriction Pc portion due to the large current generated by the electrical charge of static electricity. Thus, the wiring lines can be protected at the sacrifice of the constriction Pc not functioning as a substantial wiring line.

When the constriction Pc is not formed, as long as a line width from the second metal layer branch line Pa to the second metal layer connecting portion Pb is formed smaller than the line widths of the control line G and the power source line P, the same effects as those described above can be obtained.

Figure 7:
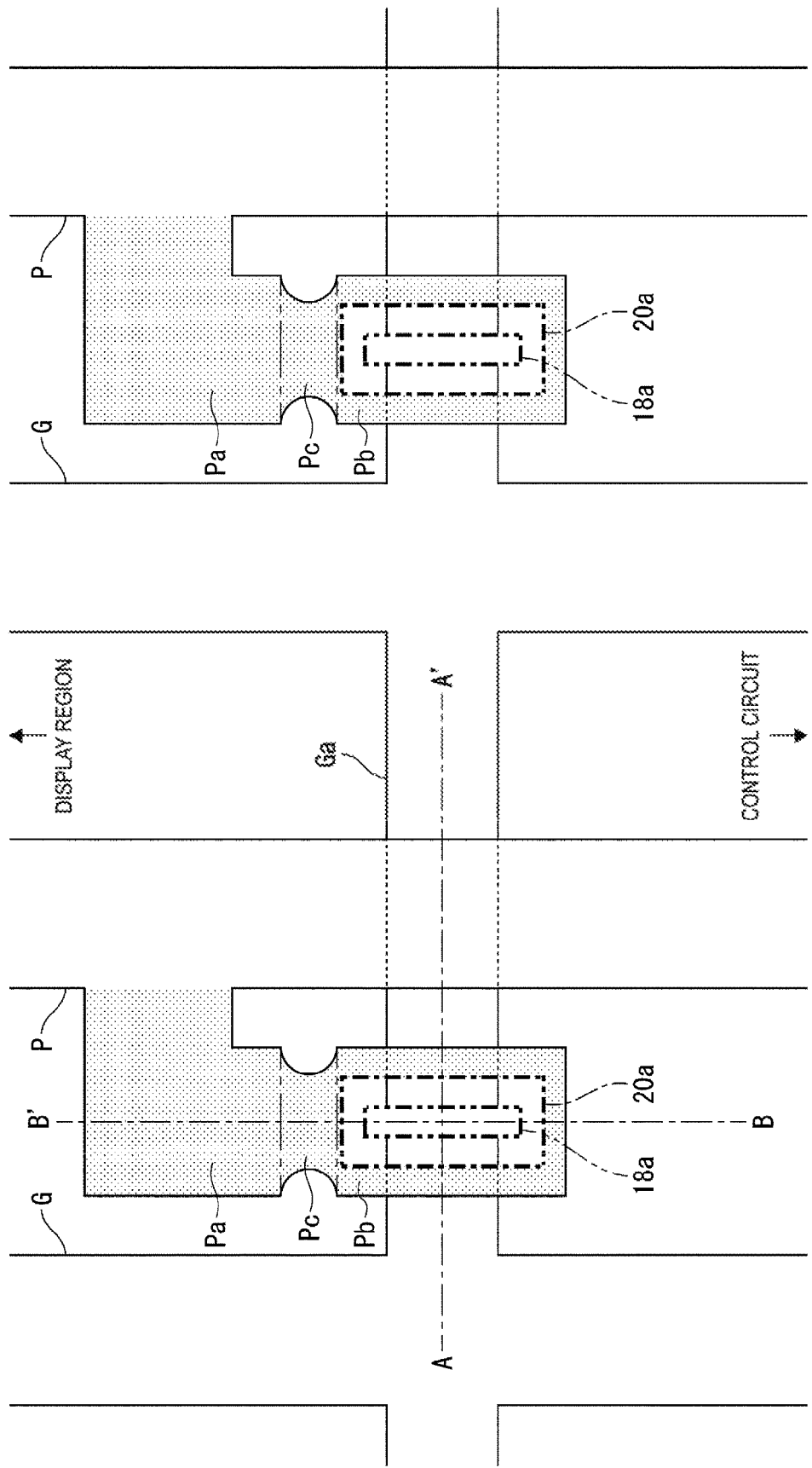
FIG. 7 is a plan view illustrating a configuration of a portion of the active matrix substrate in a subsequent stage of the stage of FIG. 5.
Figure 8:
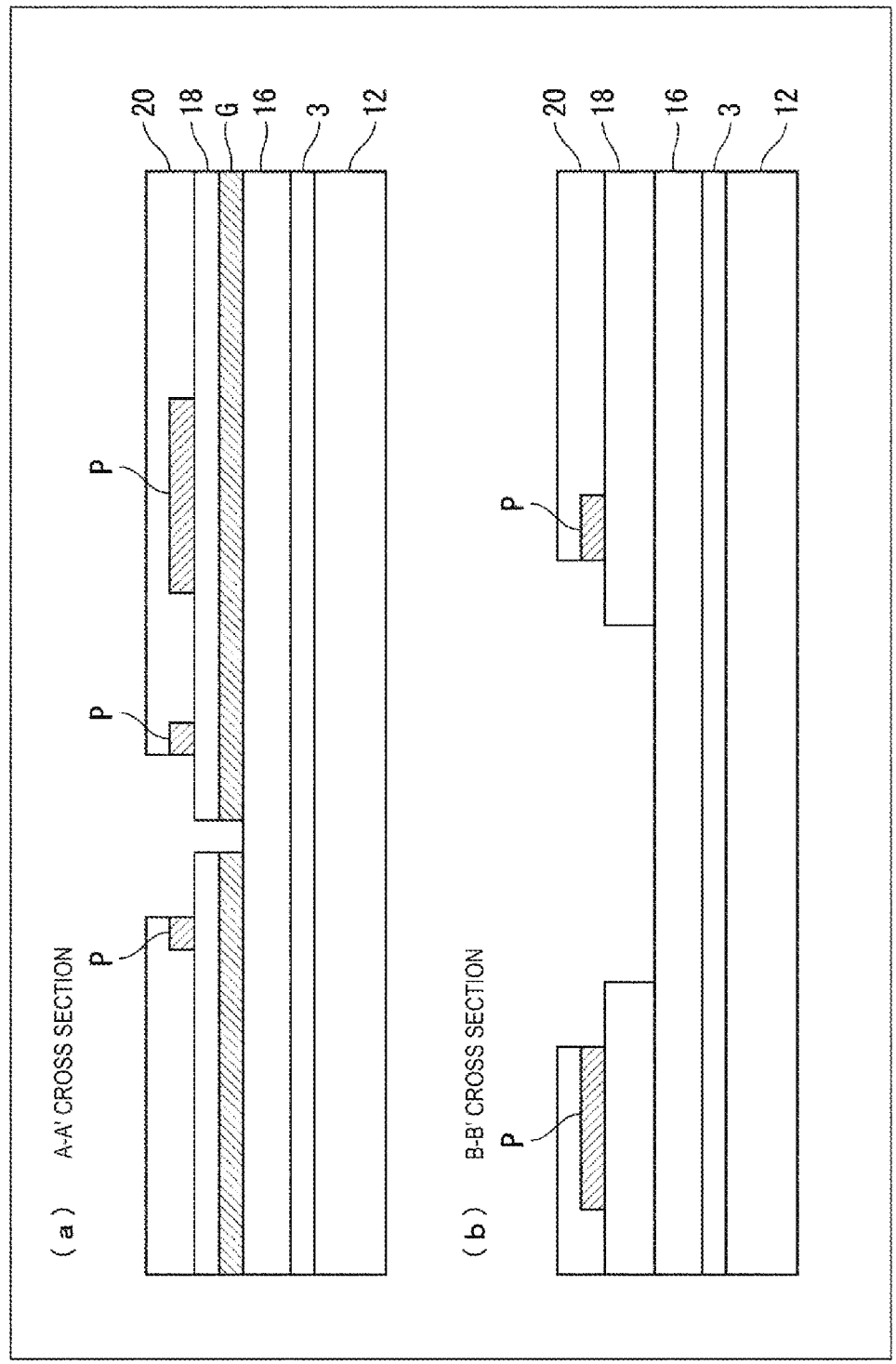
FIG. 8 illustrates cross-sectional views of cross sections taken along line A-A' and line B-B' in FIG. 7.

FIG. 7 and FIG. 8 are a plan view and a cross-sectional view, respectively, illustrating the state of the active matrix substrate in step S127 in the flowchart of FIG. 3, that is, in a stage after completion of the process of patterning the third metal layer. However, the third metal layer is not formed in the range illustrated in FIG. 7 and FIG. 8. Note that (a) and (b) of FIG. 8 are a cross-sectional view taken along line A-A' and a cross-sectional view taken along line B-B' in FIG. 7, respectively.

Note that, in FIG. 7, to distinguish portions of the second metal layer branch line Pa, the second metal layer connecting portion Pb, and the constriction Pc removed by etching and not removed by etching (portions covered by the second insulating film 20) described later, the latter is marked by a dot pattern. Further, (a) and (b) of FIG. 8 are a cross-sectional view taken along line A-A' and a cross-sectional view taken along line B-B' in FIG. 7, respectively.

This active matrix substrate undergoes the process below until the states of FIG. 7 and FIG. 8 are realized.

Third metal layer step (steps S125 to S127): The third metal layer is formed, the third metal layer is patterned, and the first metal layer branch line Ga formed in the first insulating film first opening 18a and the second metal layer connecting portion Pb formed in the second insulating film first opening 20a are etched.

By performing the etching described above, it is possible to divide the electrical connection between the power source line P and the control line G and divide the electrical connection between the control lines G adjacent to each other.

Further, when the third metal layer is patterned, the power source line P and the control line G are electrically connected to the short ring formed in the frame region 56 via the third metal layer.

The etching described above can be accomplished by performing over-etching of the etching for patterning the third metal layer.

Note that the removal of the first metal layer branch line Ga formed in the first insulating film first opening 18a and the second metal layer connecting portion Pb formed in the second insulating film first opening 20a can be performed in the etching for patterning the anode 22 formed on the flattening film 21. For example, in a case where the anode 22 includes silver (Ag) and the first metal layer and the second metal layer include molybdenum (Mo), the silver etchant also etches molybdenum, and thus the removal described above can be performed. In this case, an opening having the same shape as the second insulating film 20 may also be provided in the flattening film 21.

Through the processes described above, each of the control lines G and each of the power source lines P that have been electrically connected to each other until this time are divided, making each electrically independent. Thus, the "division measure" described above can be executed.

The active matrix substrate of the first embodiment created by the above is provided with the following configuration.

In the gap between the control circuit 57 and the display region 55, a first metal layer first branch line Ga branching from a first control line G to a second control line G of the control lines G, among the plurality of control lines G, adjacent to each other, and a first metal layer second branch line Ga branching from the second control line G to the first control line G are formed.

The first metal layer first branch line Ga and the first metal layer second branch line Ga face each other with the first insulating film first opening 18a formed in the first insulating film 18 interposed therebetween.

The power source line P is positioned between the first control line G and the second control line G.

A second metal layer intersecting portion formed in the second metal layer is formed between the first control line G and the power source line P and intersecting the first metal layer first branch line Ga and the first metal layer second branch line Ga.

In the second insulating film, the second insulating film first opening 20a is formed including the first insulating film first opening 18a.

The second metal layer intersecting portion is formed surrounding the first insulating film first opening 18a and the second insulating film first opening 20a.

The second metal layer branch line Pa branching from the power source line P and connected to the second metal layer intersecting portion is formed. The second metal layer intersecting portion may include an annular portion surrounding the first insulating film first opening 18a and the second insulating film first opening 20a.

The second metal layer branch line Pa may include the constriction Pc between the annular portion and a branch point from the power source line P.

Modified Examples of First Embodiment

Figure 9:
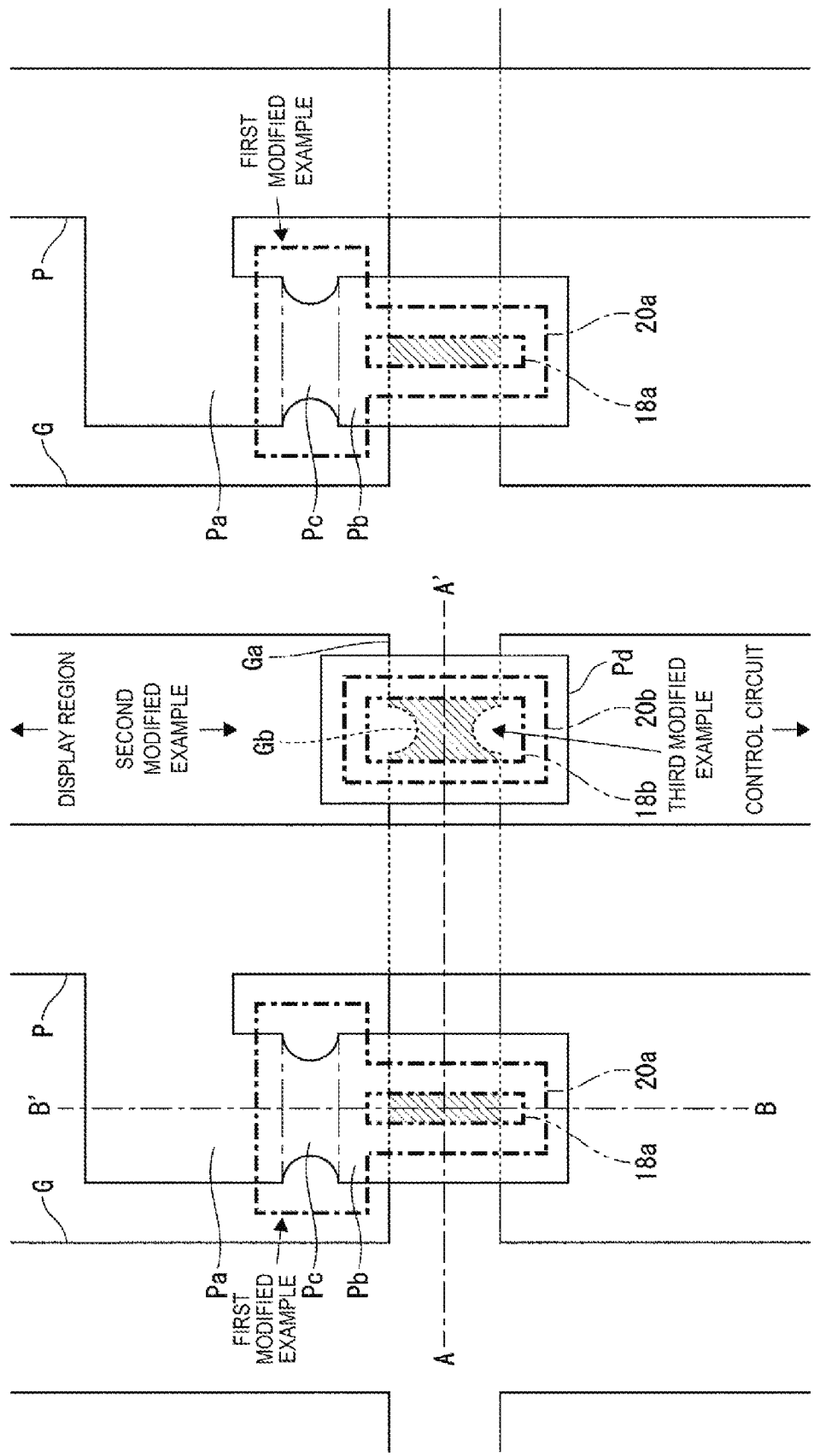
FIG. 9 is a plan view corresponding to FIG. 5 and related to a modified example of the active matrix substrate.
Figure 10:
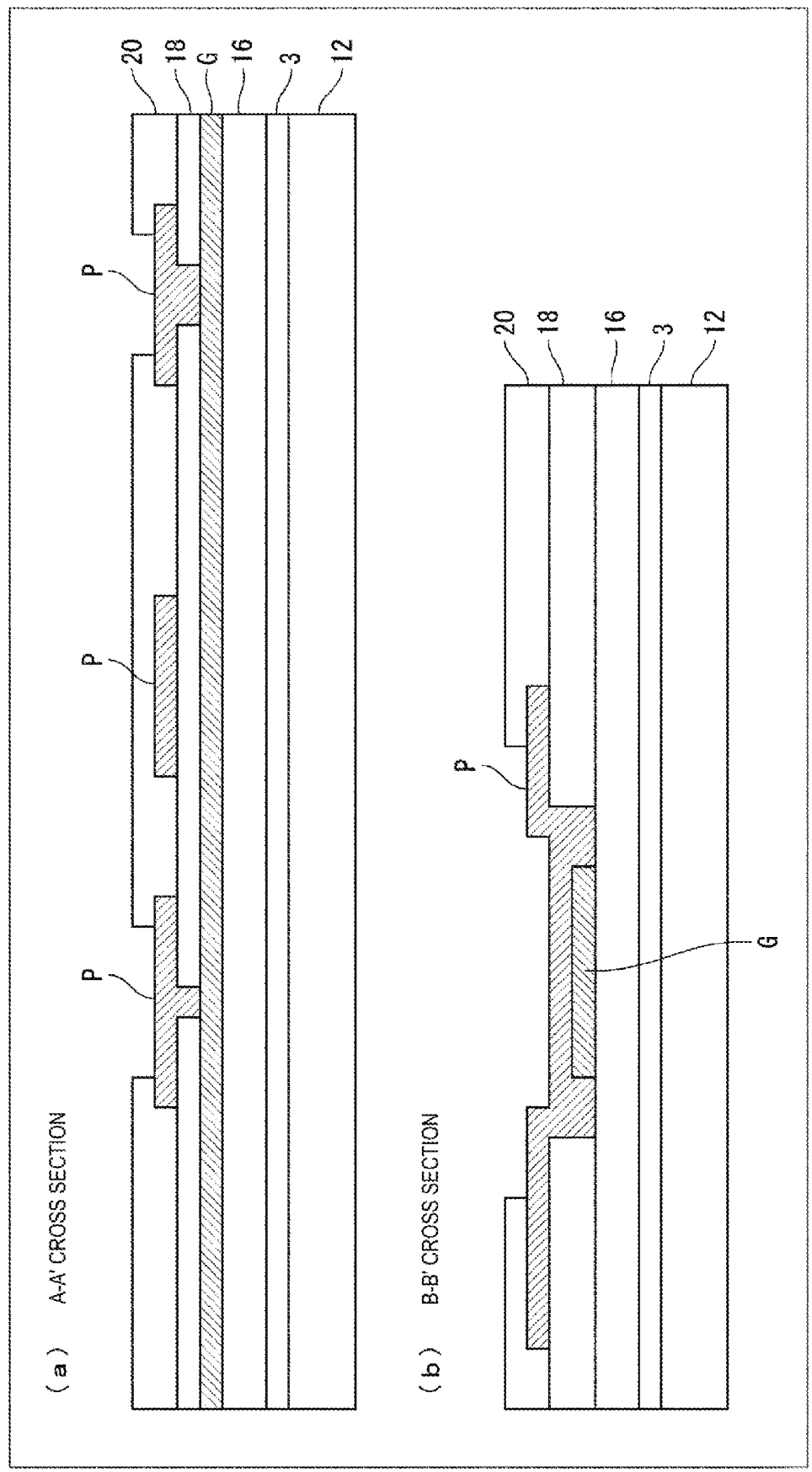
FIG. 10 is a cross-sectional view corresponding to FIG. 6 and related to the modified example of the active matrix substrate.
Figure 11:
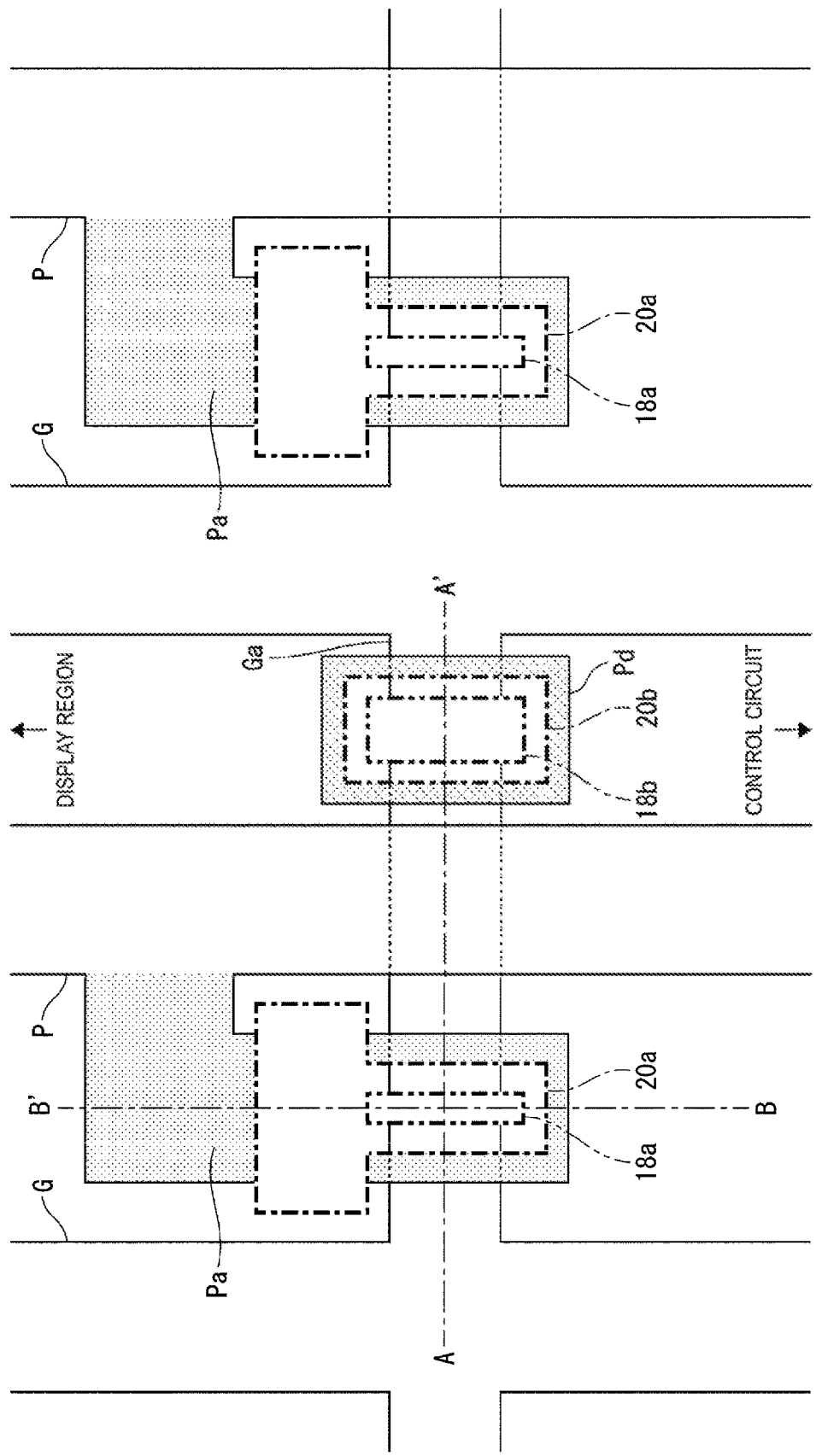
FIG. 11 is a plan view corresponding to FIG. 7 and related to the modified example of the active matrix substrate.
Figure 12:
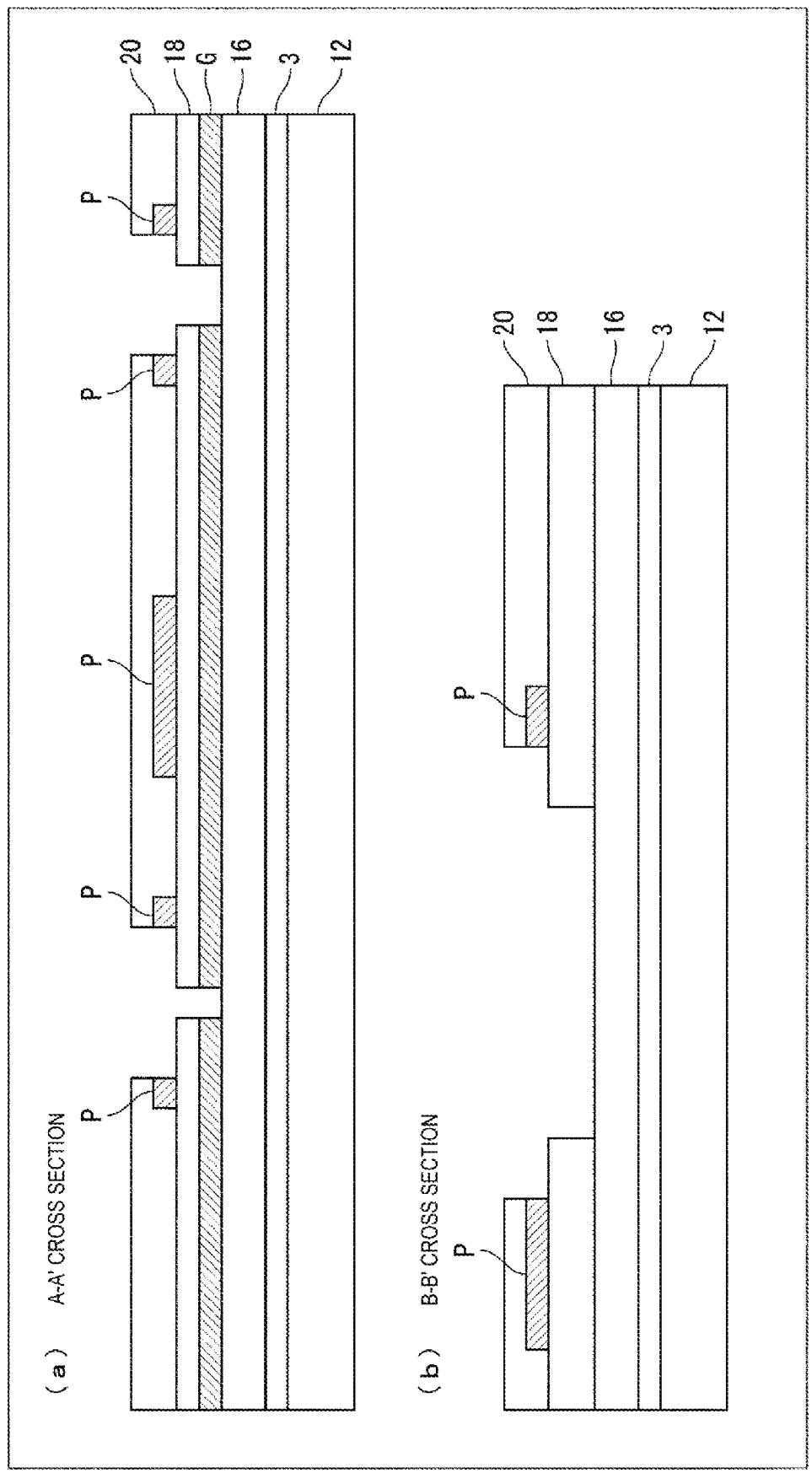
FIG. 12 is a cross-sectional view corresponding to FIG. 8 and related to the modified example of the active matrix substrate.

FIG. 9 to FIG. 12 illustrate a modified example of the first embodiment described above, and respectively correspond to FIG. 5 to FIG. 8 of the first embodiment described above. Note that the hatched portions in FIG. 9 illustrate portions where the first metal layer branch line Ga, exposed by the first insulating film first opening 18a and a first insulating film second opening 18b, the second metal layer connecting portion Pb, and an island-shaped second metal layer Pd come into contact. Further, (a) and (b) of FIG. 10 are a cross-sectional view taken along line A-A' and a cross-sectional view taken along line B-B' in FIG. 9, respectively, and (a) and (b) of FIG. 12 are a cross-sectional view taken along line A-A' and a cross-sectional view along line B-B' in FIG. 11, respectively. Additionally, in FIG. 11, portions marked with a dot pattern illustrate portions of the second metal layer branch line Pa, the second metal layer connecting portion Pb, the constriction Pc, and the island-shaped second metal layer Pd not removed by etching.

In the first modified example, the second insulating film step and the third metal layer step are each modified as follows.

Second insulating film step (refer to FIG. 9 and FIG. 10): In addition to the first insulating film first opening 18a, the second insulating film first opening 20a is formed in a portion from the second metal layer branch line Pa to the second metal layer connecting portion Pb, including a line width thereof. The second insulating film first opening 20a may be formed including the constriction Pc. Note that, in FIG. 9 and FIG. 10, the second insulating film first opening 20a is formed as a single hole, but an opening formed including the constriction Pc and an opening formed including the first insulating film first opening 18a may be formed separately.

Third metal layer step (refer to FIG. 11 and FIG. 12): The second metal layer branch line Pa and the second metal layer connecting portion Pb are divided. The portion where the constriction Pc is formed may also be divided by etching, as illustrated in FIG. 11.

According to the first modified example, by making the second metal layer connecting portion Pb a floating portion, it is possible to reduce a parasitic capacitance of the control line G and the power source line P. Further, the portion where the constriction Pc is formed is removed as well, making it possible to remove a portion in which electrostatic breakdown may have occurred.

In a second modified example, the first insulating film step, the second metal layer step, the second insulating film step, and the third metal layer step are each modified as follows.

First insulating film step: The first insulating film second opening 18b is formed in the first insulating film 18, overlapping the first metal layer branch line Ga. Thus, the first metal layer branch line Ga is exposed by the first insulating film second opening 18b.

Second metal layer step: The island-shaped second metal layer Pd is formed including the first insulating film second opening 18b. This is because, when the island-shaped second metal layer Pd is not formed, the first metal layer branch line Ga, exposed by a portion of the first insulating film second opening 18b, is etched at the moment that the second metal layer is patterned, and the electrical connection between the control lines G adjacent to each other is divided.

Second metal layer step: A second insulating film second opening 20b is formed in the second insulating film 20, including the first insulating film second opening 18b and surrounding the island-shaped second metal layer Pd. Thus, the island-shaped second metal layer Pd is exposed by the second insulating film second opening 20b.

Third metal layer step: The third metal layer is formed, the third metal layer is patterned, and the first metal layer branch line Ga formed in the first insulating film second opening 18b and the island-shaped second metal layer Pd formed in the second insulating film second opening 20b are etched. Thus, the island-shaped second metal layer Pd formed into a ring shape overlapping the first metal layer branch line Ga and thus surrounding the first insulating film second opening 18b and the second insulating film second opening 20b is obtained.

According to the second modified example, by making the portion of the first metal layer branch line Ga overlapping the power source line P a floating portion, it is possible to reduce the parasitic capacitance of the control line G and the power source line P.

In a third modified example, the first metal layer step in the second modified example is modified as follows.

First metal layer step: A constriction Gb is formed in a portion of the first metal layer branch line Ga.

According to the third modified example, in a given control line G and a given power source line P, disconnection (electrostatic breakdown) occurs in the constriction Gb portion due to the large current generated by the electrical charge of static electricity. Thus, the wiring lines can be protected at the sacrifice of the constriction Gb.

Note that, as in the second modified example, the first insulating film second opening 18b, the island-shaped second metal layer Pd, and the second insulating film second opening 20b may be provided in the constriction Gb portion, and the portion where the constriction Gb is formed may also be removed by etching in the third metal layer step of the second modified example. In the case of the second modified example and the third modified example, the electrical connection of the control lines G adjacent to each other is divided, and thus the first metal layer branch line Ga may be provided at the opening, in its entirety, in the first insulating film first opening 18a. Furthermore, when the first modified example and the second modified example or the third modified example are combined, the electrical connection between the control lines G adjacent to each other is divided even without the opening of the first insulating film first opening 18a, and the electrical connection between the control line G and the power source line P adjacent to each other is further divided by the configuration of the first modified example.

The active matrix substrate created in the second modified example is provided with the following configuration.

By the third metal layer step, the first metal layer branch line Ga when the control line G is formed is divided at two locations (the position of the first insulating film first opening 18a and the position of the first insulating film second opening 18b).

An island-shaped first metal layer formed by the first metal layer and overlapping the power source line P with the first insulating film 18 interposed therebetween is provided between, of the first metal layer branch line Ga thus divided, a portion (first metal layer first branch line) connected to the first control line G and a portion (first metal layer second branch line) connected to the second control line G.

The first metal layer first branch line and the island-shaped first metal layer face each other with the first insulating film first opening 18a interposed therebetween, and the first metal layer second branch line and the island-shaped first metal layer face each other with the first insulating film second opening 18b interposed therebetween.

Second Embodiment

FIG. 13 to FIG. 16 illustrate the configuration of a second embodiment, and correspond to FIG. 5 to FIG. 8 of the first embodiment described above, respectively. In the second embodiment, the function of the constriction Pc in the first embodiment is realized by substituting a configuration using a semiconductor layer.

Figure 13:
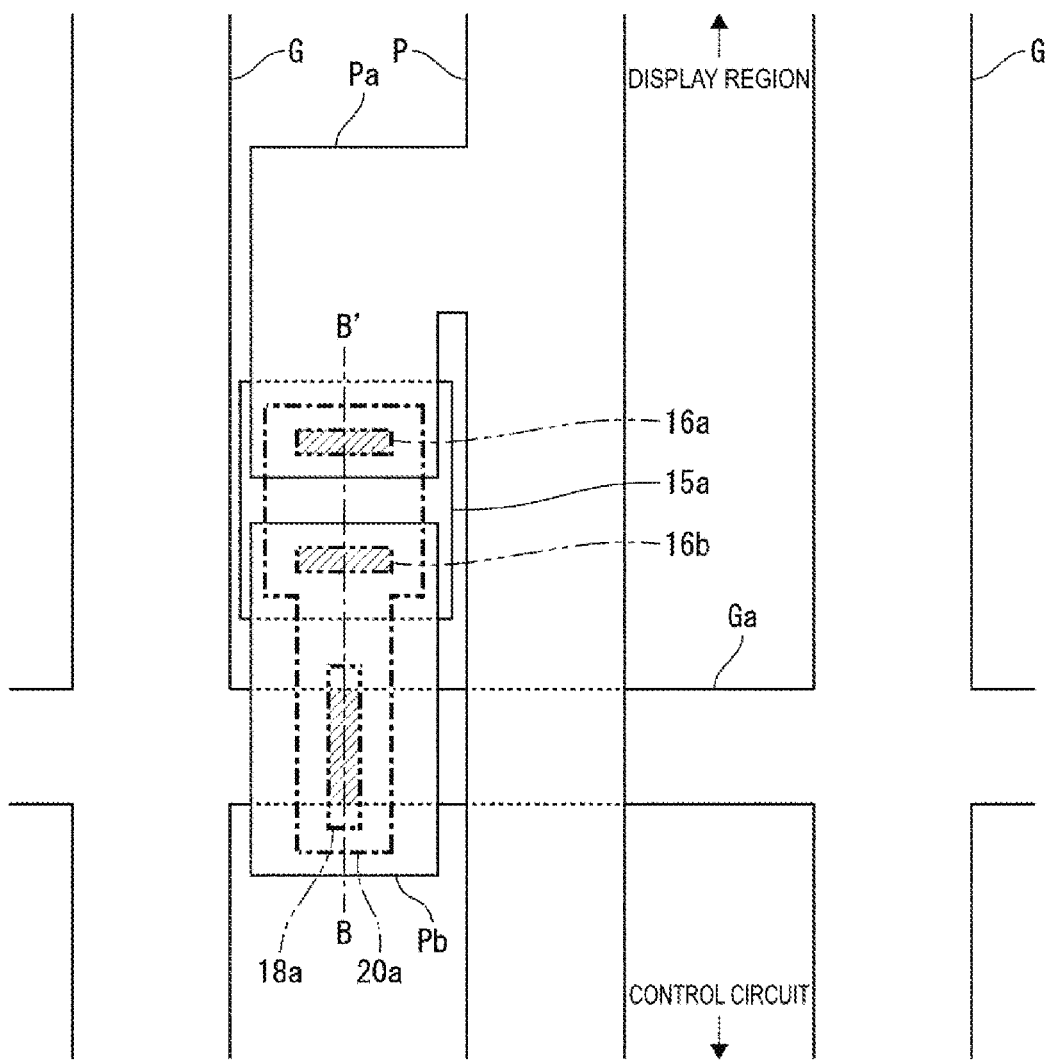
FIG. 13 is a plan view corresponding to FIG. 5 and related to another aspect (second embodiment) of the active matrix substrate.
Figure 14:
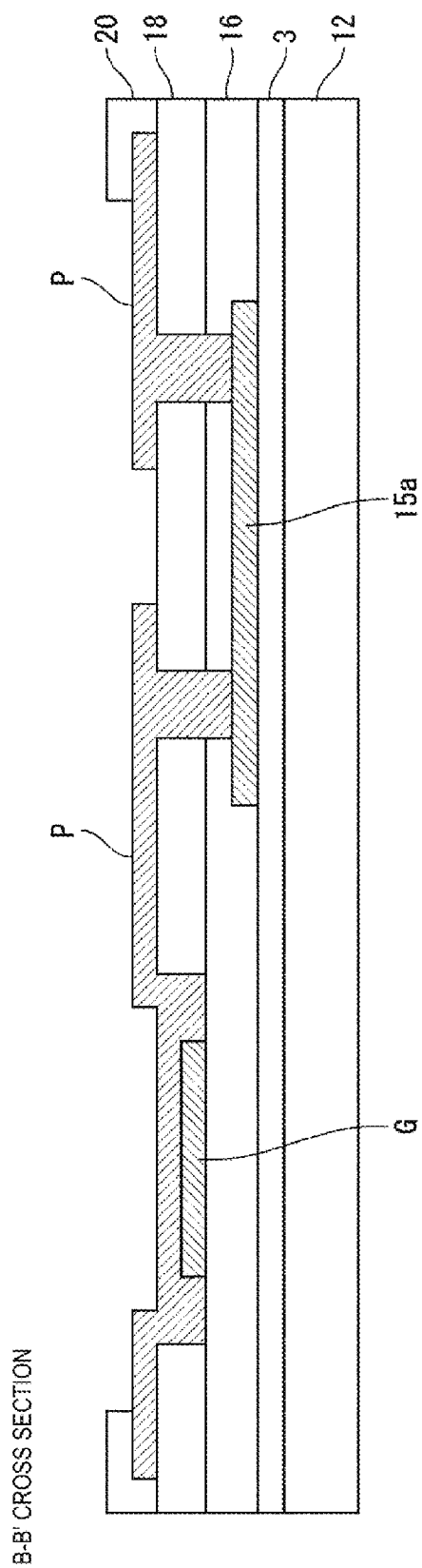
FIG. 14 is a cross-sectional view corresponding to FIG. 6 and related to the other aspect (second embodiment) of the active matrix substrate.

Note that the hatched portions in FIG. 13 illustrate portions where the first metal layer branch line Ga and the first island-shaped semiconductor layer 15a exposed by the first insulating film first opening 18a, a two-layer insulating film first opening 16a, and a two-layer insulating film second opening 16b, and the second metal layer connecting portion Pb come into contact. Further, FIG. 14 is a cross-sectional view taken along line B-B' in FIG. 13, and FIG. 16 is a cross-sectional view taken along line B-B' in FIG. 15. Further, in FIG. 15, portions marked with a dot pattern illustrate portions of the second metal layer branch line Pa and the second metal layer connecting portion Pb not removed by etching.

The following mainly describes the distinctive steps among those through which the active matrix substrate of the second embodiment realizes the states of FIG. 13 and FIG. 14 (refer to FIG. 13 and FIG. 14).

Semiconductor layer step (steps S105 to S107): A first island-shaped semiconductor layer 15a formed by the semiconductor layer 15 is formed at a position extending across the second metal layer branch line Pa and the second metal layer connecting portion Pb subsequently formed.

First metal layer step (steps S109 to S111): The control line G, the first metal layer branch line Ga, and a gate electrode are formed. Note that in the case of the bottom gate, the first metal layer step, the gate insulating film step, and the semiconductor layer step are performed in this order.

Gate insulating film step (S108): The gate insulating film 16 is formed.

First insulating film step: In the gate insulating film 16 and the first insulating film 18, the two-layer insulating film first opening 16a and the two-layer insulating film second opening 16b are formed in positions overlapping the first island-shaped semiconductor layer 15a and respectively overlapping the second metal layer branch line Pa and the second metal layer connecting portion Pb subsequently formed. Thus, the first island-shaped semiconductor layer 15a is exposed by the two-layer insulating film first opening 16a and the two-layer insulating film second opening 16b.

Second metal layer step: The second metal layer branch line Pa and the second metal layer connecting portion Pb are formed divided. Further, the second metal layer branch line Pa is connected to the first island-shaped semiconductor layer 15a via the two-layer insulating film first opening 16a. Furthermore, the second metal layer connecting portion Pb is connected to the first island-shaped semiconductor layer 15a via the two-layer insulating film second opening 16b. Thus, the second metal layer branch line Pa and the second metal layer connecting portion Pb are electrically connected via the first island-shaped semiconductor layer 15a.

Second insulating film step: The second insulating film first opening 20a is formed including the two-layer insulating film first opening 16a and the two-layer insulating film second opening 16b. Thus, the second metal layer branch line Pa and the second metal layer connecting portion Pb are exposed by the second insulating film first opening 20a.

Third metal layer step: The third metal layer is formed, the third metal layer is patterned, and the second metal layer branch line Pa and the second metal layer connecting portion Pb exposed by the second insulating film first opening 20a are etched, dividing the electrical connection between the second metal layer branch line Pa and the second metal layer connecting portion Pb.

Note that the second insulating film first opening 20a and a second insulating film first separation opening may be formed in the first insulating film first opening 18a (first group) and the two-layer insulating film first opening 16a and the two-layer insulating film second opening 16b (second group), respectively, and the second insulating film first opening 20a, the second insulating film first separation opening, and the second insulating film first separation opening may be individually formed in the first insulating film first opening 18a, the two-layer insulating film first opening 16a, and the two-layer insulating film second opening 16b, respectively. Further, for the two-layer insulating film first opening 16a and the two-layer insulating film second opening 16b, as long as at least one of the second insulating film first opening 20a or the second insulating film first separation opening is formed, in the third metal layer step, the second metal layer branch line Pa or the second metal layer connecting portion Pb exposed by the second insulating film first separation opening is etched, and the electrical connection between the second metal layer branch line Pa and the second metal layer connecting portion Pb is divided.

According to the configuration above, the resistance value of the first island-shaped semiconductor layer 15a is higher than that of the second metal layer, and thus, in a path from the power source line P to the control line G via the second metal layer branch line Pb, the second metal layer connecting portion Pb, and the first metal layer branch line Ga, the resistance of the portion of the first island-shaped semiconductor layer 15a is higher than those of other paths. Then, in a given control line G and a given power source line P, disconnection (electrostatic breakdown) occurs in the first island-shaped semiconductor layer 15a portion between the two-layer insulating film first opening 16a and the two-layer insulating film second opening 16b due to the large current generated by the electrical charge of static electricity. Thus, the wiring lines can be protected.

Figure 15:
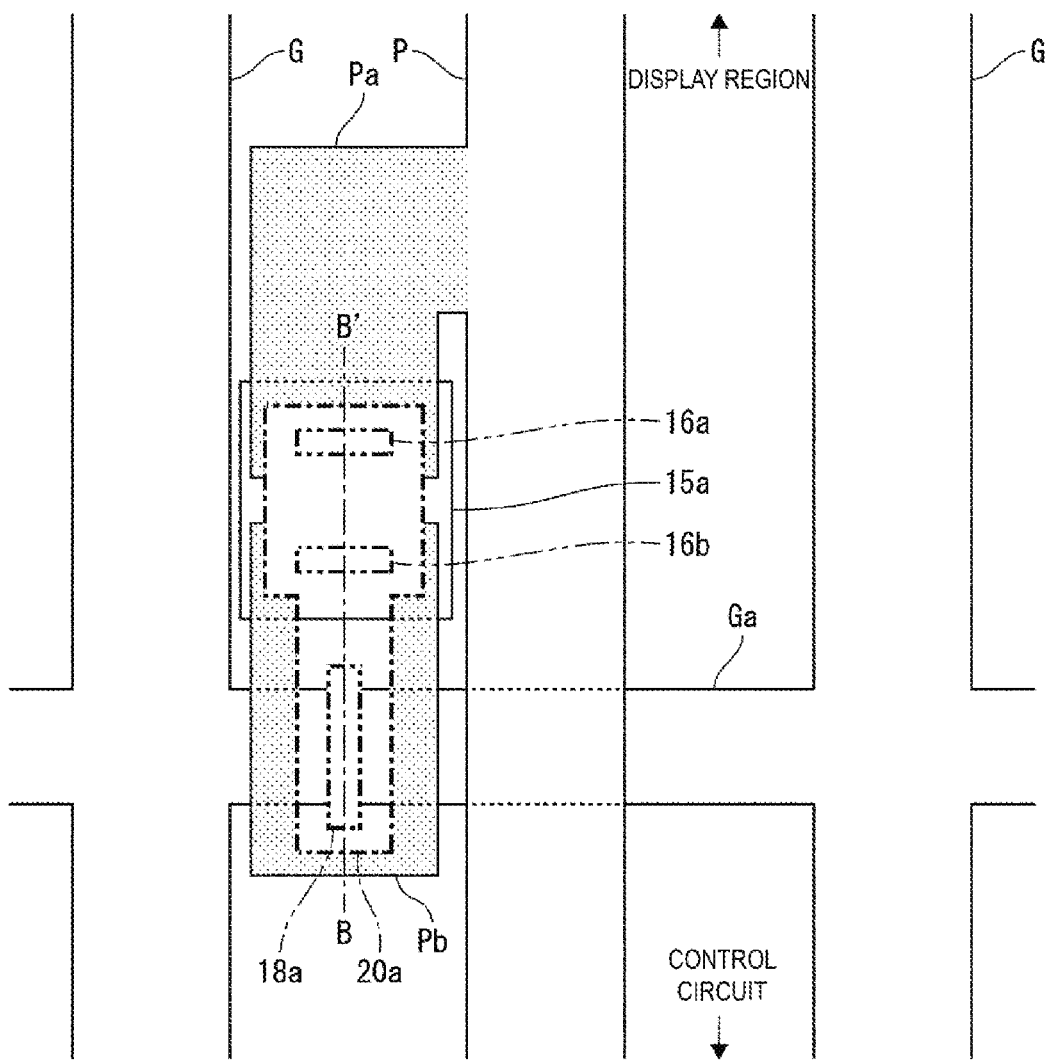
FIG. 15 is a plan view corresponding to FIG. 7 and related to the other aspect (second embodiment) of the active matrix substrate.
Figure 16:
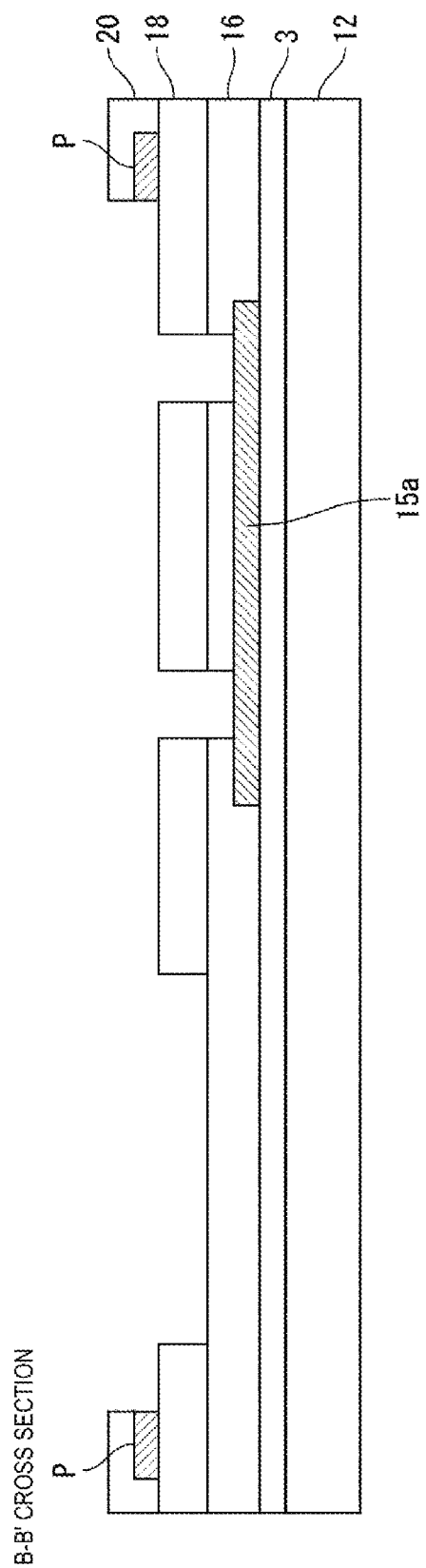
FIG. 16 is a cross-sectional view corresponding to FIG. 8 and related to the other aspect (second embodiment) of the active matrix substrate.

Subsequently, as illustrated in FIG. 15 and FIG. 16, in the third metal layer step, the first metal layer branch line Ga and the second metal layer branch line Pa are divided, and the first island-shaped semiconductor layer 15a and second metal layer branch lines Pa/second metal layer connecting portion Pb are divided.

Note that the first island-shaped semiconductor layer 15a may be, for example, a low-temperature polysilicon (LTPS), or an oxide semiconductor (for example, an In—Ga—Zn—O based semiconductor). However, the first island-shaped semiconductor layer 15a needs to be electrically conductive. Electrical conduction can be achieved by doping in the case of the low-temperature polysilicon and by an electrical conduction treatment (plasma treatment; for example, hydrogen plasma treatment or He plasma treatment) in the case of the oxide semiconductor. The first island-shaped semiconductor layer 15a has a higher resistance than a metal, and thus it is not necessary to provide the constriction Pc of the first embodiment.

The active matrix substrate created by the second embodiment is provided with the following configuration.

The first island-shaped semiconductor layer 15a is provided formed in the semiconductor layer 15, extending across the second metal layer intersecting portion and the second metal layer branch line Pa, the second metal layer branch line Pa being formed branching from the power source line P.

Modified Example of Second Embodiment

FIG. 17 to FIG. 20 illustrate a modified example of the second embodiment described above, and respectively correspond to FIG. 13 to FIG. 16 of the second embodiment described above.

Figure 17:
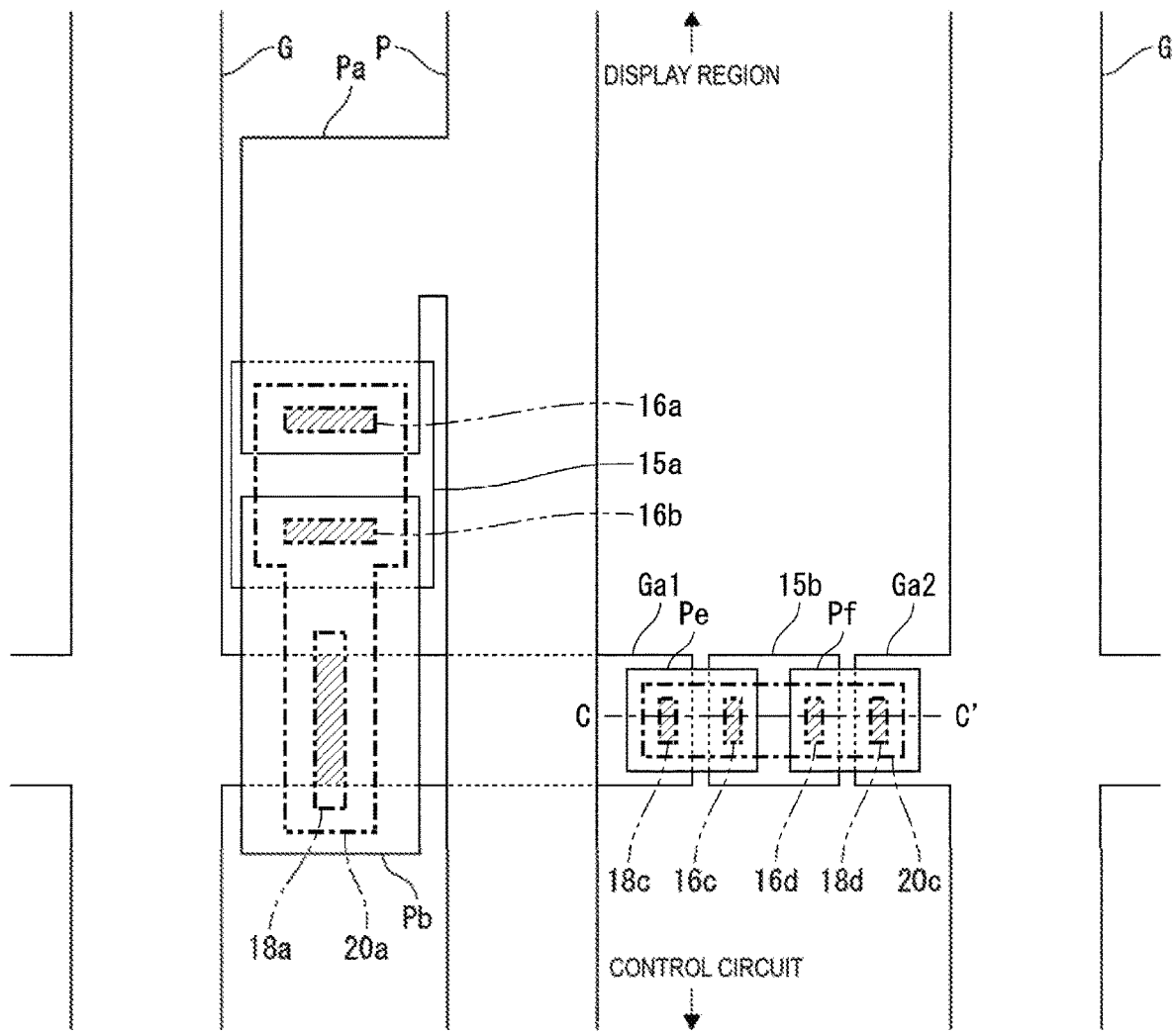
FIG. 17 is a plan view corresponding to FIG. 5 and related to a modified example of the other aspect (second embodiment) of the active matrix substrate.
Figure 18:
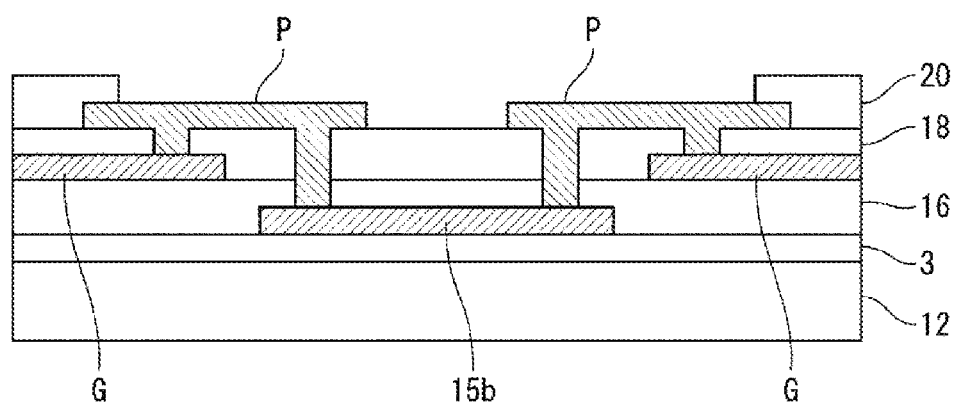
FIG. 18 is a cross-sectional view corresponding to FIG. 6 and related to the modified example of the other aspect (second embodiment) of the active matrix substrate.
Figure 19:
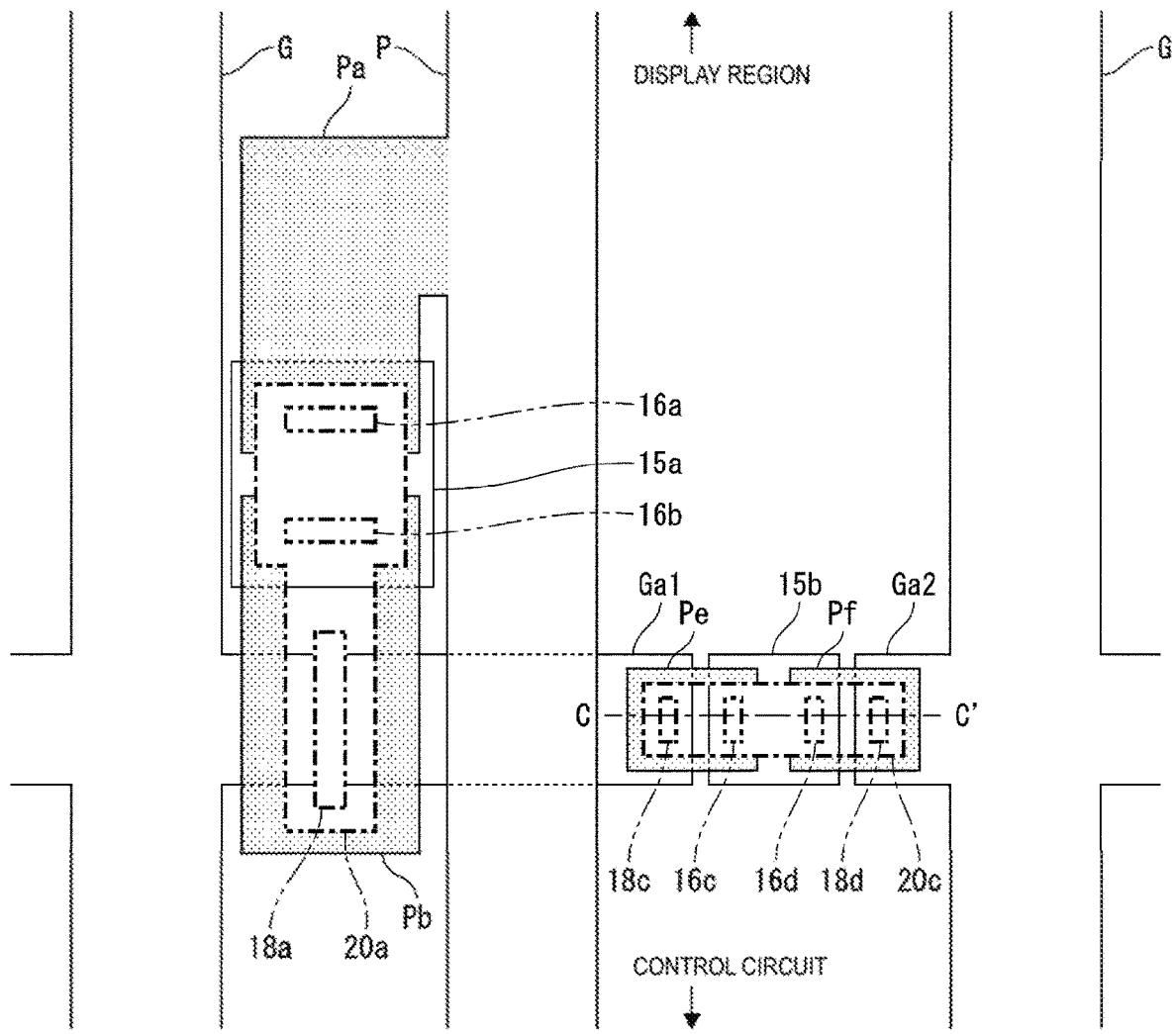
FIG. 19 is a plan view corresponding to FIG. 7 and related to the modified example of the other aspect (second embodiment) of the active matrix substrate.
Figure 20:
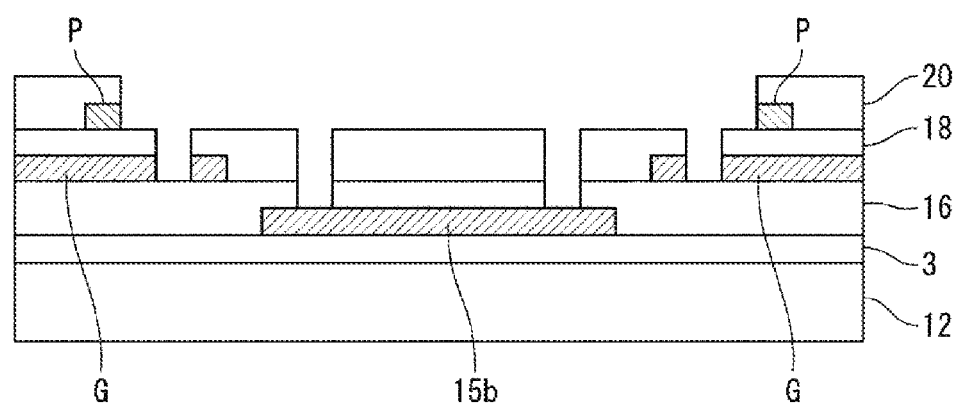
FIG. 20 is a cross-sectional view corresponding to FIG. 8 and related to the modified example of the other aspect (second embodiment) of the active matrix substrate.

Note that the hatched portions in FIG. 17 illustrate portions where the first metal layer branch line Ga, the first island-shaped semiconductor layer 15a, and the second island-shaped semiconductor layer 15b, exposed by the first insulating film first opening 18a, a first insulating film third opening 18c, a first insulating film fourth opening 18d, the two-layer insulating film first opening 16a, the two-layer insulating film second opening 16b, a two-layer insulating film third opening 16c, and a two-layer insulating film fourth opening 16d, and the second metal layer connecting portion Pb, a first island-shaped second metal layer Pe, and a second island-shaped second metal layer Pf come into contact. Further, FIG. 18 is a cross-sectional view taken along line C-C' in FIG. 17, and FIG. 20 is a cross-sectional view taken along line C-C' in FIG. 19. Further, in FIG. 19, portions marked with a dot pattern illustrate portions of the second metal layer branch line Pa, the second metal layer connecting portion Pb, the first island-shaped second metal layer Pe, and the second island-shaped second metal layer Pf not removed by etching.

The following mainly describes the distinctive steps among those through which the active matrix substrate of the present modified example realizes the states of FIG. 17 and FIG. 18 (refer to FIG. 17 and FIG. 18).

Semiconductor layer step: A second island-shaped semiconductor layer 15b formed by the semiconductor layer 15 is formed at a position between a first metal layer branch line Ga1 and a first metal layer second branch line Ga2 subsequently formed.

First metal layer step: The first metal layer first branch line Ga1 branching from the first control line G to the second control line G of the control lines G adjacent to each other, and the first metal layer second branch line Ga2 branching from the second control line G to the first control line G are formed as the first metal layer branch line Ga. Note that the disposed relationship is such that the second island-shaped semiconductor layer 15b is positioned between the first metal layer first branch line Ga1 and the first metal layer second branch line Ga2.

First insulating film step: The first insulating film third opening 18c is formed in the first insulating film 18, overlapping the first metal layer first branch line Ga1, the first insulating film fourth opening 18d is formed in the first insulating film 18, overlapping the first metal layer second branch line Ga2, and the two-layer insulating film third opening 16c and the two-layer insulating film fourth opening 16d are formed in the gate insulating film 16 and the first insulating film 18, overlapping the second island-shaped semiconductor layer 15b.

Second metal layer step: The first island-shaped second metal layer Pe is formed extending across the first metal layer first branch line Ga1 and the second island-shaped semiconductor layer 15b, and the second island-shaped second metal layer Pf is formed extending across the first metal layer second branch line Ga2 and the second island-shaped semiconductor layer 15b. Further, the first metal layer first branch line Ga1 and the first island-shaped second metal layer Pe are connected via the first insulating film third opening 18c, and the first metal layer second branch line Ga2 and the second island-shaped second metal layer Pf are connected via the first insulating film fourth opening 18d. Furthermore, the second island-shaped semiconductor layer 15b and the first island-shaped second metal layer Pe are connected via the two-layer insulating film third opening 16c, and the second island-shaped semiconductor layer 15b and the second island-shaped second metal layer Pf are connected via the two-layer insulating film fourth opening 16d. Thus, the first metal layer first branch line Ga1 and the first metal layer second branch line Ga2 (that is, the control lines G adjacent to each other) are electrically connected via the first island-shaped second metal layer Pe, the second island-shaped semiconductor layer 15b, and the second island-shaped second metal layer Pf.

Second insulating film step: A second insulating film third opening 20c is formed including the first insulating film third opening 18c, the first insulating film fourth opening 18d, the two-layer insulating film third opening 16c, and the two-layer insulating film fourth opening 16d. Note that the second insulating film third opening 20c may be provided as each of the individual openings of the first insulating film third opening 18c, the first insulating film fourth opening 18d, the two-layer insulating film third opening 16c, and the two-layer insulating film fourth opening 16d. When the second insulating film third opening 20c is provided as an opening for any one of the first insulating film third opening 18c, the first insulating film fourth opening 18d, the two-layer insulating film third opening 16c, and the two-layer insulating film fourth opening 16d, in the third metal step, the first island-shaped second metal layer Pe or the second island-shaped second metal layer Pf exposed by the second insulating film third opening 20c are etched, and the electrical connection between the first metal layer first branch line Ga1 and the first metal layer second branch line Ga2 is divided.

Third metal layer step (refer to FIG. 19 and FIG. 20): The first metal layer first branch line Ga1 formed in the first insulating film third opening 18c, the first metal layer second branch line Ga2 formed in the first insulating film fourth opening 18d, and the first island-shaped second metal layer Pe and the second island-shaped second metal layer Pf formed in the second insulating film third opening 20c are etched.

In the case of the present embodiment, the electrical connection of the control lines G adjacent to each other is divided, and thus the first metal layer branch line Ga may be provided at the opening, in its entirety, in the first insulating film first opening 18a. Furthermore, even without the opening of the first insulating film first opening 18a, the electrical connection of the control lines G adjacent to each other is divided, and the electrical connection between the control line G and the power source line P adjacent to each other is also divided (because the electrical connection between the second metal layer branch line Pa and the second metal layer connecting portion Pb is divided).

According to the configuration above, the resistance value of the second island-shaped semiconductor layer 15b is higher than that of the second metal layer, and thus, in the path between the control lines G adjacent to each other, the resistance value of the portion of the second island-shaped semiconductor layer 15b is higher than those of other paths. Then, in a given control line G and a given power source line P, disconnection (electrostatic breakdown) occurs in the second island-shaped semiconductor layer 15b portion between the two-layer insulating film third opening 16c and the two-layer insulating film fourth opening 16d due to the large current generated by the electrical charge of static electricity. Thus, the wiring lines can be protected.

The active matrix substrate created in this modified example is provided with the following configuration.

The second island-shaped semiconductor layer 15b is provided formed between the island-shaped first metal layer and the first metal layer second branch line.

The first island-shaped second metal layer Pe is provided with a portion thereof overlapping the island-shaped first metal layer, and another portion thereof overlapping the second island-shaped semiconductor layer.

The second island-shaped second metal layer Pf is provided with a portion thereof overlapping the first metal layer second branch line, and another portion thereof overlapping the second island-shaped semiconductor layer.

5. Supplement

While one aspect embodying the disclosure has been described above, the features of the one aspect embodying the disclosure can be understood as follows.

The manufacturing method for an active matrix substrate according to one aspect embodying the disclosure includes the following steps.

Forming the base insulating film.

Forming a first wiring line layer including a plurality of first wiring lines as an upper layer of the base insulating film.

Forming a first insulating film as an upper layer of the first wiring line layer.

Forming a second wiring line layer including a plurality of second wiring lines as an upper layer of the first insulating film.

Forming a second insulating film as an upper layer of the second wiring line layer.

Forming a third wiring line layer including a plurality of third wiring lines as an upper layer of the second insulating film.

Then, the manufacturing method described above includes the following features as first features.

In forming the first wiring line layer, a first wiring line connecting portion that partially connects the first wiring lines adjacent to each other is formed.

Subsequent to forming the second wiring line layer, the plurality of first wiring lines are connected to a circuit element outside of a display region, and the first wiring line connecting portion is divided.

Further, the manufacturing method described above includes the following features as second features.

In forming the second wiring line layer, a second wiring line connecting portion that connects each of the plurality of second wiring lines to the first wiring line layer via a via hole formed in the first insulating film is formed.

Subsequent to forming the second insulating film, the plurality of second wiring lines are connected to a circuit element outside of the display region, and the second wiring line connecting portion is divided.

Further, the manufacturing method described above includes the following features as third features.

In forming the second wiring line layer, the second wiring line connecting portion is formed connected to the first wiring line connecting portion.

The division of the first wiring line connecting portion and the division of the second wiring line connecting portion are performed in the same step.

Further, the active matrix substrate according to one aspect embodying the disclosure includes the following configuration.

A base insulating film.

A first wiring line layer that forms an upper layer of the base insulating film and includes a plurality of first wiring lines.

A first insulating film that forms an upper layer of the first wiring line layer.

A second wiring line layer that forms an upper layer of the first insulating film and includes a plurality of second wiring lines.

A second insulating film that forms an upper layer of the second wiring line layer.

A third wiring line layer that forms an upper layer of the second insulating film and includes a plurality of third wiring lines.

A third insulating film (flattening film) that forms an upper layer of the third wiring line layer.

Then, the active matrix substrate described above includes the following feature as a first feature.

The first insulating film is interposed and the third insulating film is partially interposed between the first wiring lines adjacent to each other.

Further, the active matrix substrate described above includes the following feature as a second feature.

In the third insulating film, when a portion interposed between the first wiring lines adjacent to each other follows an interface formed with the first wiring line toward an upper layer side, the portion is connected to the interface formed with the second wiring line layer.

The disclosure is not limited to each of the embodiments described above, and various modifications may be made within the scope of the claims. Embodiments obtained by appropriately combining technical approaches disclosed in each of the different embodiments also fall within the technical scope of the disclosure. Moreover, novel technical features can be formed by combining the technical approaches disclosed in the embodiments.

The invention claimed is:

1. A manufacturing method for a display device including
a display region,
a frame region positioned around the display region,
a plurality of control lines,
a plurality of power source lines parallel to the plurality of control lines,
a plurality of data signal lines intersecting the plurality of control lines,
the plurality of control lines, the plurality of power source lines, and the plurality of data signal lines being provided from the display region to the frame region,
a control circuit forming a longitudinal direction in a direction orthogonal to the plurality of control lines in the frame region, the control circuit being configured to input a control signal to the plurality of control lines,
a base insulating film,
a first metal layer forming the plurality of control lines
a first insulating film,
a second metal layer forming the plurality of power source lines,
a second insulating film, and
a third metal layer forming the plurality of data signal lines,
the base insulating film, the first metal layer, the first insulating film, the second metal layer, the second insulating film, and the third metal layer being layered in this order, and
the plurality of control lines being electrically connected to the control circuit via the second metal layer or the third metal layer in the frame region, the method comprising:
a base insulating film step of forming the base insulating film;
a first metal layer step of forming the first metal layer and patterning the first metal layer, thereby forming the plurality of control lines and forming, in a gap between respective formation positions of the control circuit and the display region, a first metal layer branch line branching from each of the plurality of control lines toward a control line of the plurality of control lines adjacent thereto;

a first insulating film step of forming the first insulating film and patterning the first insulating film, thereby forming, in the first insulating film, a first insulating film first opening overlapping the first metal layer branch line;

a second metal layer step of forming the second metal layer and patterning the second metal layer, thereby forming the plurality of power source lines and, in the gap, forming a second metal layer branch line branching from each of the plurality of power source lines and forming a second metal layer connecting portion connected to the first metal layer branch line via the first insulating film first opening;

a second insulating film step of forming the second insulating film and patterning the second insulating film, thereby forming, in the second insulating film, a second insulating film first opening exposing the first insulating film first opening, a portion of the second metal layer branch line, and a portion of the second metal layer connecting portion; and a third metal layer step of forming the third metal layer, patterning the third metal layer, and etching the first metal layer branch line formed in the first insulating film first opening, and the second metal layer branch line and the second metal layer connecting portion formed in the second insulating film first opening.

2. The manufacturing method for a display device according to claim 1, wherein control lines, among the plurality of control lines, adjacent to each other share the first metal layer branch line.

3. The manufacturing method for a display device according to claim 1, wherein the first metal layer branch line has a width orthogonal to an extending direction thereof that is smaller than a width of the first insulating film first opening in the same direction.

4. The manufacturing method for a display device according to claim 1, wherein, in the third metal layer step, the second metal layer branch line and the second metal layer connecting portion are divided.

5. The manufacturing method for a display device according to claim 1, wherein, in the second metal layer step, a constriction is formed in a portion from the second metal layer branch line to the second metal layer connecting portion.

6. The manufacturing method for a display device according to claim 5, wherein, in the third metal layer step, the portion where the constriction is formed is also etched.

7. The manufacturing method for a display device according to claim 1,
wherein, in the first insulating film step, a first insulating film second opening is formed in the first insulating film, overlapping the first metal layer branch line,
in the second metal layer step, an island-shaped second metal layer is formed including the first insulating film second opening,
in the second insulating film step, a second insulating film second opening is formed in the second insulating film, including the first insulating film second opening and surrounded by the island-shaped second metal layer, and
in the third metal layer step, the first metal layer branch line formed in the first insulating film second opening and the island-shaped second metal layer formed in the second insulating film second opening are etched.

8. The manufacturing method for a display device according to claim 7, wherein, in the first metal layer step, a constriction is formed in the first metal layer branch line at a position exposed by the first insulating film second opening.

9. The manufacturing method for a display device according to claim 1, further comprising:
between the base insulating film step and the first metal layer step,
a semiconductor layer step of forming a semiconductor layer and patterning the semiconductor layer, thereby forming the semiconductor layer; and
a gate insulating film step of forming a gate insulating film,
wherein, in the semiconductor layer step, a first island-shaped semiconductor layer formed by the semiconductor layer is formed at a position extending across the second metal layer branch line and the second metal layer connecting portion,
in the first insulating film step, a two-layer insulating film first opening and a two-layer insulating film second opening are formed in the gate insulating film and the first insulating film, overlapping the first island-shaped semiconductor layer,
in the second metal layer step, the second metal layer branch line and the second metal layer connecting portion are formed divided,
the second metal layer branch line is connected to the first island-shaped semiconductor layer via the two-layer insulating film first opening,
the second metal layer connecting portion is connected to the first island-shaped semiconductor layer via the two-layer insulating film second opening,
the second metal layer branch line and the second metal layer connecting portion are electrically connected via the first island-shaped semiconductor layer,
in the second insulating film step, the second insulating film first opening is formed further including at least one of the two-layer insulating film first opening and the two-layer insulating film second opening, or a second insulating film first separation opening including at least one of the two-layer insulating film first opening and the two-layer insulating film second opening is formed, and
in the third metal layer step, the second metal layer branch line or the second metal layer connecting portion formed in the second insulating film first separation opening is etched.

10. The manufacturing method for a display device according to claim 1, further comprising:
between the base insulating film step and the first metal layer step,
a semiconductor layer step of forming a semiconductor layer and patterning the semiconductor layer, thereby forming the semiconductor layer; and
a gate insulating film step of forming a gate insulating film,
wherein, in the semiconductor layer step, a second island-shaped semiconductor layer formed by the semiconductor layer is formed at a position between a first metal layer first branch line and a first metal layer second branch line,
in the first metal layer step, the first metal layer first branch line branching from a first control line to a second control line of adjacent control lines among the plurality of control lines, and the first metal layer second branch line branching from the second control line to the first control line are formed as the first metal layer branch line, in the first insulating film step, a first insulating film third opening is formed in the first insulating film, overlapping the first metal layer first branch line, a first insulating film fourth opening is formed in the first insulating film, overlapping the first metal layer second branch line, and a two-layer insulating film third opening and a two-layer insulating film fourth opening are formed in the gate insulating film and the first insulating film, overlapping the second island-shaped semiconductor layer, in the second metal layer step, a first island-shaped second metal layer and a second island-shaped second metal layer are formed extending across the first metal layer first branch line and the second island-shaped semiconductor layer and extending across the first metal layer second branch line and the second island-shaped semiconductor layer, respectively, the first metal layer first branch line and the first island-shaped second metal layer are connected via the first insulating film third opening, the first metal layer second branch line and the second island-shaped second metal layer are connected via the first insulating film fourth opening, and the second island-shaped semiconductor layer and the first island-shaped second metal layer are connected via the two-layer insulating film third opening, and the second island-shaped semiconductor layer and the second island-shaped second metal layer are connected via the two-layer insulating film fourth opening, in the second insulating film step, a second insulating film third opening is formed including at least one of the first insulating film third opening, the first insulating film fourth opening, the two-layer insulating film third opening, and the two-layer insulating film fourth opening, and in the third metal layer step, the first island-shaped second metal layer or the second island-shaped second metal layer formed in the second insulating film third opening is etched.

11. A display device comprising:
a display region;
a frame region positioned around the display region;
a plurality of control lines;
a plurality of power source lines parallel to the plurality of control lines;
a plurality of data signal lines intersecting the plurality of control lines,
the plurality of control lines, the plurality of power source lines, and the plurality of data signal lines being provided from the display region to the frame region;
a control circuit forming a longitudinal direction in a direction orthogonal to the plurality of control lines in the frame region, the control circuit being configured to input a control signal to the plurality of control lines;
a base insulating film;
a first metal layer forming the plurality of control lines;
a first insulating film;
a second metal layer forming the plurality of power source lines;
a second insulating film; and
a third metal layer forming the plurality of data signal lines,
the base insulating film, the first metal layer, the first insulating film, the second metal layer, the second insulating film, and the third metal layer being layered in this order, and
the plurality of control lines being electrically connected to the control circuit via the second metal layer or the third metal layer in the frame region,
wherein, in a gap between the control circuit and the display region, a first metal layer first branch line branching from a first control line to a second control line of adjacent control lines of the plurality of control lines, and a first metal layer second branch line branching from the second control line to the first control line are formed,
the first metal layer first branch line and the first metal layer second branch line face each other with the first insulating film first opening formed in the first insulating film interposed therebetween,
a second metal layer intersecting portion including a power source line, among the plurality of power source lines, between the first control line and the second control line, and formed by the second metal layer is formed between the first control line and the second control line, intersecting the first metal layer first branch line and the first metal layer second branch line, and
in the second insulating film, a second insulating film first opening is formed including the first insulating film first opening, and the second metal layer intersecting portion is formed surrounding the first insulating film first opening and the second insulating film first opening.

12. The display device according to claim 11,
wherein a second metal layer branch line is formed branching from the power source line of the plurality of power source lines and connecting to the second metal layer intersecting portion and
the second metal layer intersecting portion includes an annular portion surrounding the first insulating film first opening and the second insulating film first opening.

13. The display device according to claim 12,
wherein the second metal layer branch line includes a constriction between the annular portion and a branch point from the power source line of the plurality of power source lines.

14. The display device according to claim 11, further comprising:
an island-shaped first metal layer formed by the first metal layer, between the first metal layer first branch line and the first metal layer second branch line, and overlapping the power source line of the plurality of power source lines with the first insulating film interposed therebetween,
wherein the first metal layer first branch line and the island-shaped first metal layer face each other with the first insulating film first opening interposed therebetween, and
the first metal layer second branch line and the island-shaped first metal layer face each other with the first insulating film second opening interposed therebetween.

15. The display device according to claim 14, further comprising:
a second island-shaped semiconductor layer formed between the island-shaped first metal layer and the first metal layer second branch line;

a first island-shaped second metal layer formed with a portion thereof overlapping the island-shaped first metal layer and another portion thereof overlapping the second island-shaped semiconductor layer; and a second island-shaped second metal layer formed with a portion thereof overlapping the first metal layer second branch line and another portion thereof overlapping the second island-shaped semiconductor layer.

16. The display device according to claim 11, further comprising:
- a second metal layer branch line branching from the power source line of the plurality of power source lines; and
- a first island-shaped semiconductor layer formed by a semiconductor layer, extending across the second metal layer intersecting portion and the second metal layer branch line.

* * * * *